(12) United States Patent
Yu et al.

(10) Patent No.: US 11,189,603 B2
(45) Date of Patent: Nov. 30, 2021

(54) SEMICONDUCTOR PACKAGES AND METHODS OF FORMING SAME

(71) Applicant: Taiwan Semiconductor Manufacturing Company, Ltd., Hsinchu (TW)

(72) Inventors: Chen-Hua Yu, Hsinchu (TW); Der-Chyang Yeh, Hsinchu (TW); Han-Ping Pu, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 7 days.

(21) Appl. No.: 16/206,281

(22) Filed: Nov. 30, 2018

(65) Prior Publication Data

US 2019/0096862 A1  Mar. 28, 2019

Related U.S. Application Data

(62) Division of application No. 15/694,273, filed on Sep. 1, 2017, now Pat. No. 10,529,698.

(Continued)

(51) Int. Cl.
*H01L 25/10* (2006.01)
*H01L 23/48* (2006.01)
(Continued)

(52) U.S. Cl.
CPC .......... *H01L 25/105* (2013.01); *H01L 21/561* (2013.01); *H01L 21/568* (2013.01);
(Continued)

(58) Field of Classification Search
CPC ... H01L 25/105; H01L 23/14; H01L 23/3677; H01L 23/49811; H01L 23/5384;
(Continued)

(56) References Cited

U.S. PATENT DOCUMENTS 9,000,584 B2   4/2015   Lin et al.
9,048,222 B2   6/2015   Hung et al.
(Continued)

FOREIGN PATENT DOCUMENTS

CN   106057773 A   10/2016
CN   106449560 A   2/2017
(Continued)

*Primary Examiner* — Hoang-Quan Ho
(74) *Attorney, Agent, or Firm* — Slater Matsil, LLP

(57) ABSTRACT

An embodiment is a package including a first package structure. The first package structure includes a first integrated circuit die having an active side and a back-side, the active side comprising die connectors, a first electrical connector adjacent the first integrated circuit die, an encapsulant laterally encapsulating the first integrated circuit die and the first electrical connector, a first redistribution structure on and electrically connected to the die connectors of the first integrated circuit die and the first electrical connector, and thermal elements on the back-side of the first integrated circuit die. The package further includes a second package structure bonded to the first electrical connector and the thermal elements with a first set of conductive connectors.

20 Claims, 36 Drawing Sheets

Related U.S. Application Data

(60) Provisional application No. 62/471,717, filed on Mar. 15, 2017.

(51) Int. Cl.

| | | |
|---|---|---|
| *H01L 23/00* | (2006.01) | |
| *H01L 23/367* | (2006.01) | |
| *H01L 23/31* | (2006.01) | |
| *H01L 21/56* | (2006.01) | |
| *H01L 25/00* | (2006.01) | |
| *H01L 23/14* | (2006.01) | |
| *H01L 23/498* | (2006.01) | |
| *H01L 23/538* | (2006.01) | |
| *H01L 25/065* | (2006.01) | |
| *H01L 23/42* | (2006.01) | |
| *H01L 21/48* | (2006.01) | |

(52) U.S. Cl.
CPC .......... *H01L 23/14* (2013.01); *H01L 23/3128* (2013.01); *H01L 23/367* (2013.01); *H01L 23/3677* (2013.01); *H01L 23/481* (2013.01); *H01L 23/49811* (2013.01); *H01L 23/5384* (2013.01); *H01L 24/19* (2013.01); *H01L 24/20* (2013.01); *H01L 24/25* (2013.01); *H01L 24/92* (2013.01); *H01L 24/97* (2013.01); *H01L 25/50* (2013.01); *H01L 21/486* (2013.01); *H01L 23/42* (2013.01); *H01L 23/49816* (2013.01); *H01L 23/49827* (2013.01); *H01L 23/49833* (2013.01); *H01L 23/5389* (2013.01); *H01L 25/0657* (2013.01); *H01L 2221/68345* (2013.01); *H01L 2224/04105* (2013.01); *H01L 2224/12105* (2013.01); *H01L 2224/2518* (2013.01); *H01L 2224/32145* (2013.01); *H01L 2224/32225* (2013.01); *H01L 2224/73259* (2013.01); *H01L 2224/73265* (2013.01); *H01L 2224/73267* (2013.01); *H01L 2224/83005* (2013.01); *H01L 2224/9222* (2013.01); *H01L 2224/92244* (2013.01); *H01L 2224/97* (2013.01); *H01L 2225/0651* (2013.01); *H01L 2225/06568* (2013.01); *H01L 2225/06589* (2013.01); *H01L 2225/1035* (2013.01); *H01L 2225/1041* (2013.01); *H01L 2225/1058* (2013.01); *H01L 2225/1094* (2013.01); *H01L 2924/15311* (2013.01); *H01L 2924/18162* (2013.01)

(58) Field of Classification Search
CPC ..... H01L 21/561; H01L 24/19; H01L 23/481; H01L 24/20; H01L 21/568; H01L 23/367; H01L 25/50; H01L 23/3128; H01L 23/42; H01L 2221/68345; H01L 2225/1058; H01L 2225/06589; H01L 25/0657; H01L 2225/0651; H01L 2224/97; H01L 2224/83; H01L 2224/73265; H01L 2224/32145; H01L 2224/48227; H01L 2924/00012; H01L 24/97; H01L 24/92; H01L 24/25; H01L 2224/73267; H01L 2225/06568; H01L 2224/92244; H01L 2924/15311; H01L 23/5389; H01L 23/49816; H01L 2224/04105; H01L 2224/9222; H01L 2924/18162; H01L 2225/1094; H01L 2224/12105; H01L 21/486; H01L 2224/32225; H01L 2224/2518; H01L 23/49827; H01L 2225/1035; H01L 23/49833; H01L 2224/73259; H01L 2225/1041; H01L 2224/83005; H01L 25/18; H01L 2924/00014; H01L 2224/131; H01L 2224/96; H01L 24/96; H01L 24/32; H01L 24/83; H01L 24/81; H01L 2224/92125; H01L 2224/83102; H01L 2224/73204; H01L 24/29; H01L 2224/83191; H01L 2224/73215; H01L 2224/92242; H01L 2224/16227; H01L 2224/48145; H01L 24/16; H01L 2224/16145; H01L 24/03; H01L 24/11; H01L 2224/8181; H01L 2224/16503; H01L 2224/81895; H01L 2224/81815; H01L 24/48; H01L 2224/13082; H01L 2224/13084; H01L 2224/03612; H01L 2224/03614; H01L 2224/0345; H01L 2224/03462; H01L 2224/03464; H01L 2224/0347; H01L 24/05; H01L 2224/0401; H01L 2224/1144; H01L 2224/11849; H01L 2224/11452; H01L 24/13; H01L 2224/11424; H01L 2224/1145; H01L 2224/11462; H01L 2224/1132; H01L 2224/11334; H01L 2224/13144; H01L 2224/13164; H01L 2224/13155; H01L 2224/11464
See application file for complete search history.

(56) References Cited

U.S. PATENT DOCUMENTS

| | | | |
|---|---|---|---|
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 2015/0108635 | A1 | 4/2015 | Liang et al. |
| 2015/0228580 | A1 | 8/2015 | Chen et al. |
| 2016/0111359 | A1 | 4/2016 | Chen et al. |
| 2016/0133613 | A1 | 5/2016 | Seo et al. |
| 2016/0307788 | A1 | 10/2016 | Hu et al. |
| 2016/0315071 | A1 | 10/2016 | Zhai et al. |
| 2018/0240729 | A1* | 8/2018 | Kim ..................... H01L 23/367 |

FOREIGN PATENT DOCUMENTS

| | | |
|---|---|---|
| KR | 20140111546 A | 9/2014 |
| KR | 2015009551 | 8/2015 |
| KR | 20170026170 | 3/2017 |
| TW | 201615066 A | 4/2016 |
| TW | 201709473 A | 3/2017 |
| WO | 2017039275 A1 | 3/2017 |

* cited by examiner

SEMICONDUCTOR PACKAGES AND METHODS OF FORMING SAME

This application is a divisional of U.S. patent application Ser. No. 15/694,273, entitled "SEMICONDUCTOR PACKAGES AND METHODS OF FORMING SAME," filed on Sep. 1, 2017, which claims priority to U.S. Provisional Application No. 62/471,717, entitled "SEMICONDUCTOR PACKAGES AND METHODS OF FORMING SAME," filed on Mar. 15, 2017, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
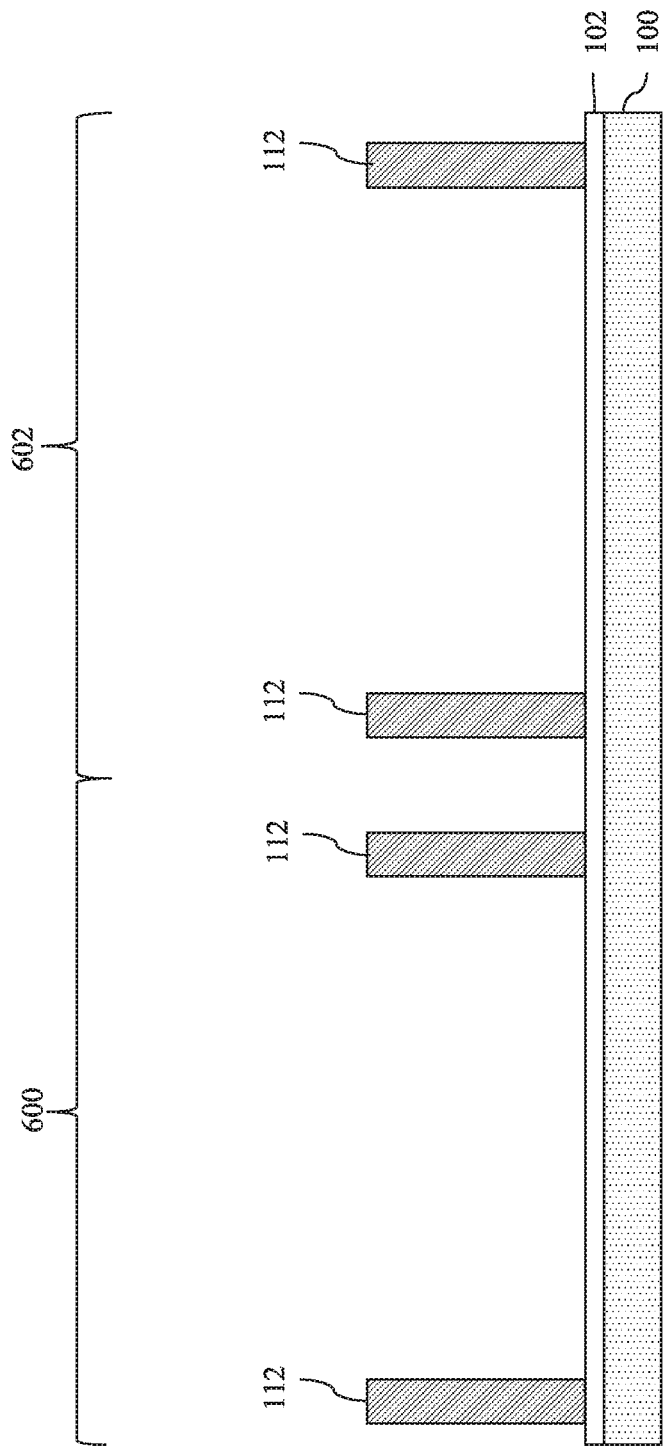
FIGS. 1 through 12 illustrate cross-sectional views of intermediate steps during a process for forming a package structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure including thermal elements on a back-side of a semiconductor die. The thermal elements in the disclosed embodiments are not utilized to electrically connect devices or metallization patterns in the package structures but are utilized to dissipate heat from the package structures. In some embodiments, the thermal elements are not connected to thermal dissipation paths, while in some embodiments, the thermal elements are connected to thermal dissipation paths in the semiconductor die. For example, the thermal elements can be connected to a via that is thermally coupled/connected to one or more transistors in the semiconductor die to dissipate the heat generated by the transistor(s). The embodiments of the present disclosure can improve the thermal resistance (° C./Watt) of the package structure by up to about 8% over a package structure that does not include the thermal elements on a back-side of a semiconductor die.

Further, the teachings of this disclosure are applicable to any package structure including one or more semiconductor die. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIGS. 1 through 12 illustrate cross-sectional views of intermediate steps during a process for forming a first package structure in accordance with some embodiments. FIG. 1 illustrates a carrier substrate 100 and a release layer 102 formed on the carrier substrate 100. A first package region 600 and a second package region 602 for the formation of a first package and a second package, respectively, are illustrated.

The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of coplanarity.

Further in FIG. 1, electrical connectors 112 are formed. As an example to form the electrical connectors 112, a seed layer is formed over the release layer 102. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form electrical connectors 112.

Figure 2:
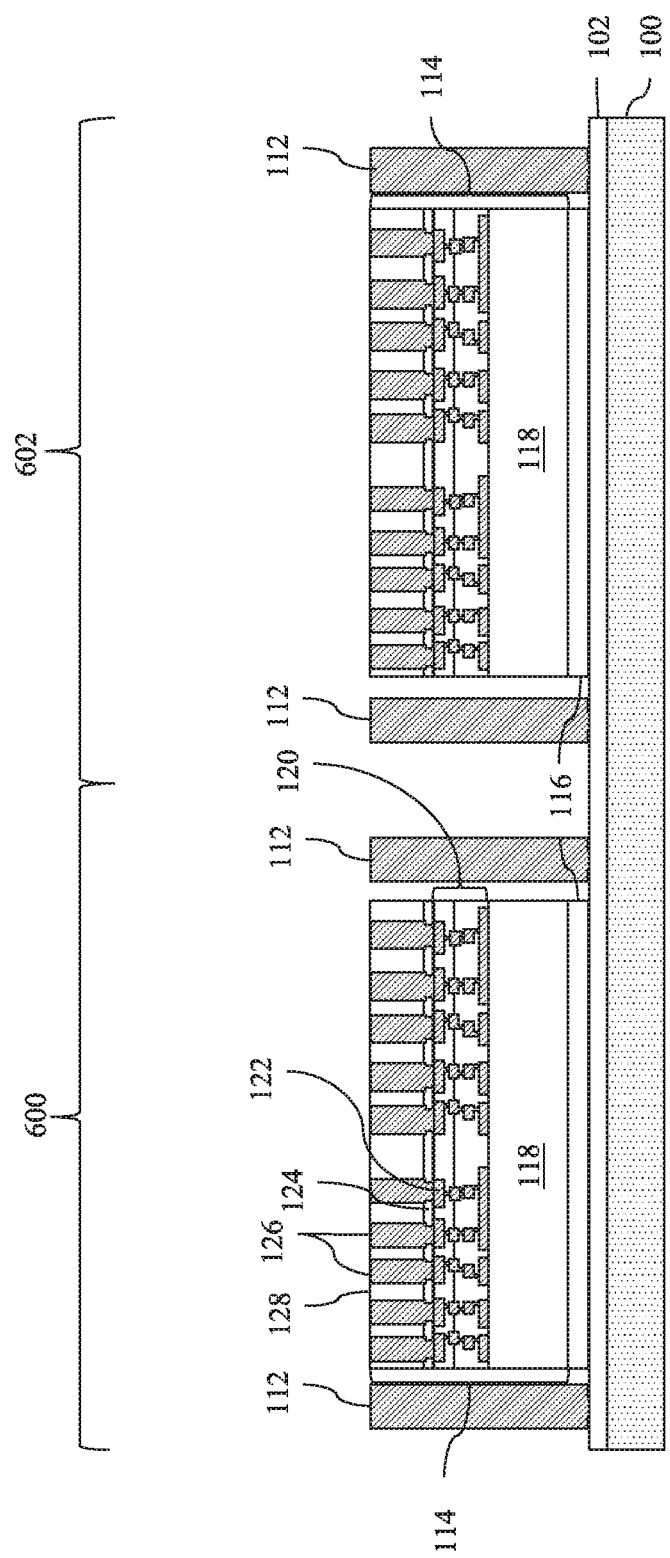

In FIG. 2, integrated circuit dies 114 are adhered to the release layer 102 by an adhesive 116. As illustrated in FIG. 2, one integrated circuit die 114 is adhered in each of the first package region 600 and the second package region 602, and in other embodiments, more integrated circuit dies 114 may be adhered in each region. For example, in an embodiment, two integrated circuit dies 114 or four integrated circuit dies 114 may be adhered in each region. The integrated circuit dies 114 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in the embodiments with multiple dies in each of the regions, the integrated circuit dies 114 may be different sizes (e.g., different heights and/or surface areas), and in other embodiments, the integrated circuit dies 114 may be the same size (e.g., same heights and/or surface areas).

Before being adhered to the release layer 102, the integrated circuit dies 114 may be processed according to applicable manufacturing processes to form integrated circuits in the integrated circuit dies 114. For example, the integrated circuit dies 114 each include a semiconductor substrate 118, such as silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings are through the passivation films 124 to the pads 122. Die connectors 126, such as conductive pillars (for example, comprising a metal such as copper), are in the openings through passivation films 124 and are mechanically and electrically coupled to the respective pads 122. The die connectors 126 may be formed by, for example, plating, or the like. The die connectors 126 electrically couple the respective integrated circuits of the integrated circuit dies 114.

A dielectric material 128 is on the active sides of the integrated circuit dies 114, such as on the passivation films 124 and the die connectors 126. The dielectric material 128 laterally encapsulates the die connectors 126, and the dielectric material 128 is laterally coterminous with the respective integrated circuit dies 114. The dielectric material 128 may be a polymer such as polybenzoxazole (PBO), polyimide, benzocyclobutene (BCB), or the like. In other embodiments, the dielectric material 128 is formed of a nitride such as silicon nitride; an oxide such as silicon oxide, phosphosilicate glass (PSG), borosilicate glass (BSG), boron-doped phosphosilicate glass (BPSG), or the like; the like, or a combination thereof, and may be formed, for example, by spin coating, lamination, chemical vapor deposition (CVD), or the like.

Adhesive 116 is on back-sides of the integrated circuit dies 114 and adheres the integrated circuit dies 114 to the release layer 102. The adhesive 116 may be any suitable adhesive, epoxy, die attach film (DAF), or the like. In some embodiments, the adhesive has a thickness in a range from about 5 µm to about 30 µm with the thickness being measured in a direction perpendicular to the back-side of the respective integrated circuit die 114. The adhesive 116 may be applied to a back-side of the integrated circuit dies 114, such as to a back-side of the respective semiconductor wafer or may be applied over the surface of the carrier substrate 100. The integrated circuit dies 114 may be singulated, such as by sawing or dicing, and adhered to the release layer 102 by the adhesive 116 using, for example, a pick-and-place tool.

Figure 3:
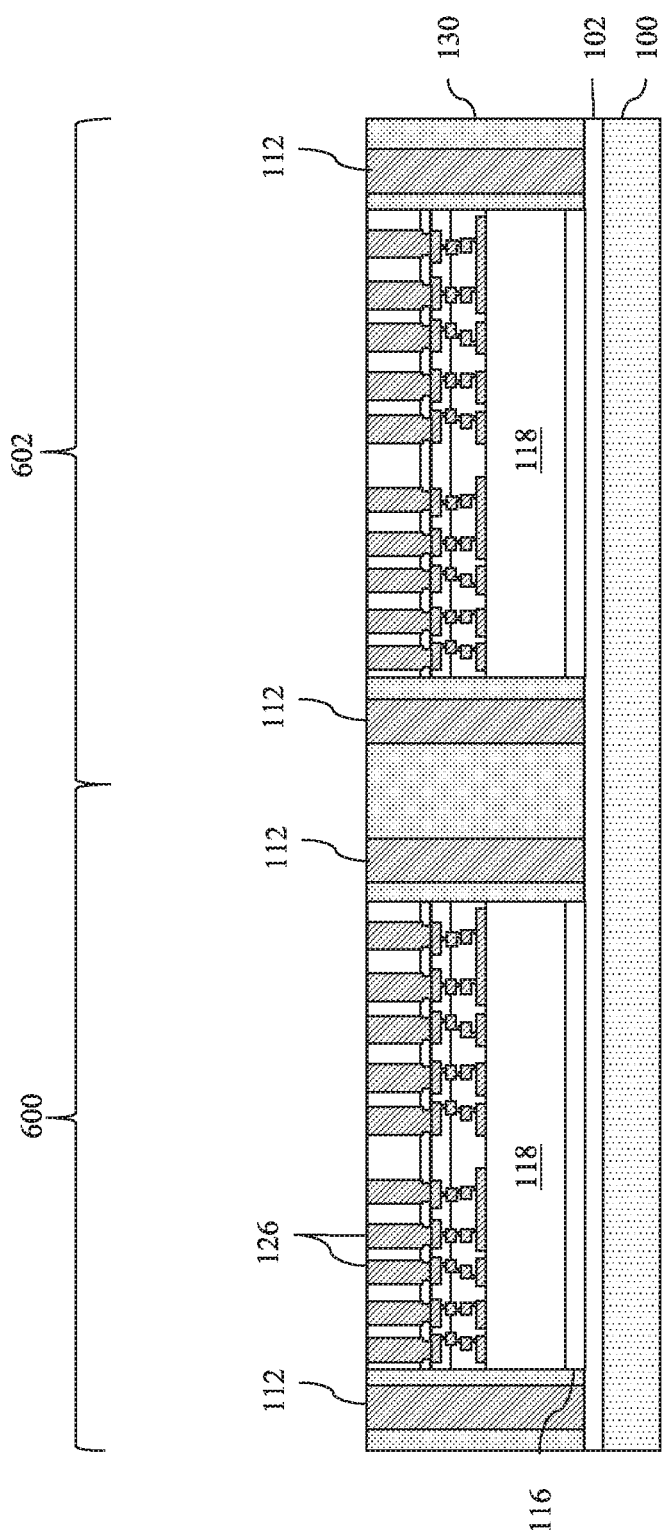

In FIG. 3, an encapsulant 130 is formed on the various components. The encapsulant 130 may be a molding compound, epoxy, or the like, and may be applied by compression molding, transfer molding, or the like. After curing, the encapsulant 130 can undergo a grinding process to expose the electrical connectors 112 and die connectors 126. Top surfaces of the electrical connectors 112, die connectors 126, and encapsulant 130 are level after the grinding process. In some embodiments, the grinding may be omitted, for example, if electrical connectors 112 and die connectors 126 are already exposed. The electrical connectors 112 may be referred to as through vias 112 hereinafter.

Figure 4:
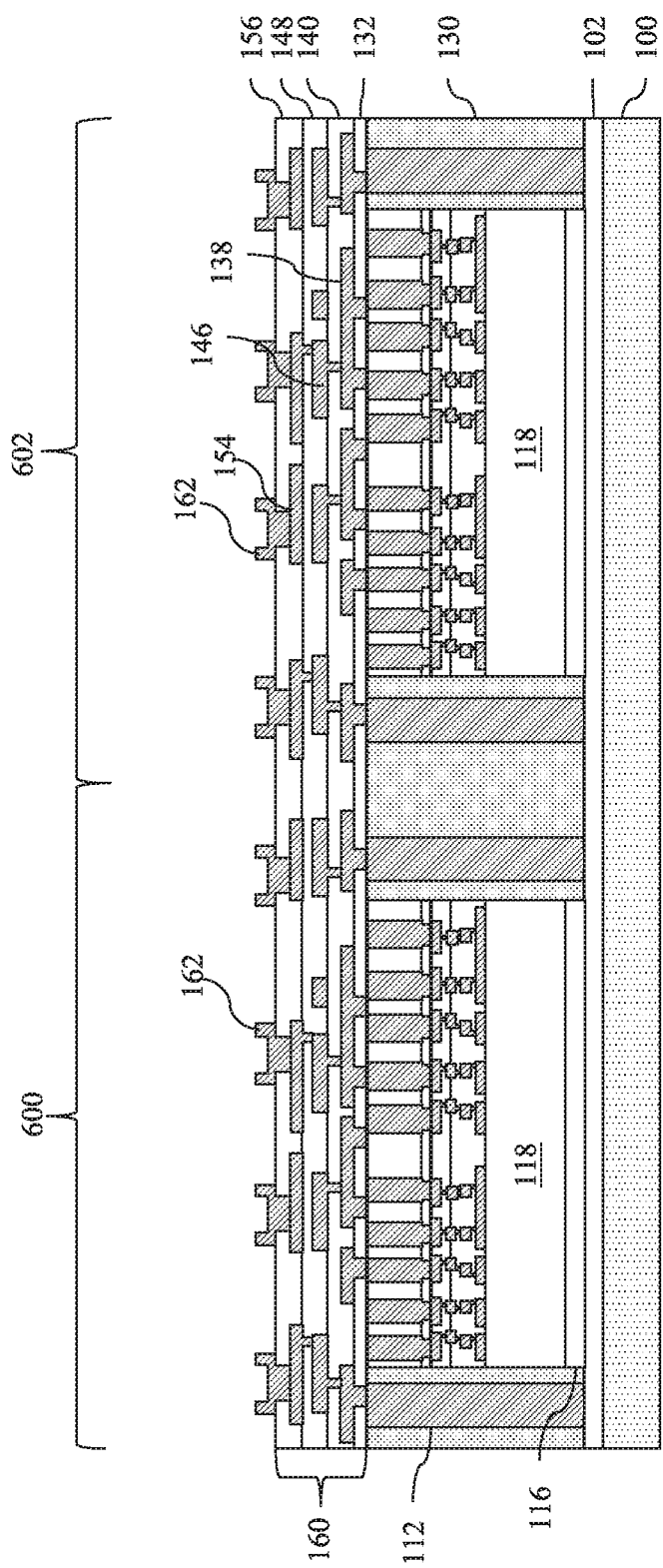

In FIG. 4, a front-side redistribution structure 160 is formed. The front-side redistribution structure 160 includes dielectric layers 132, 140, 148, and 156 and metallization patterns 138, 146, and 154.

The formation of the front-side redistribution structure 160 may begin by depositing the dielectric layer 132 on the encapsulant 130, through vias 112, and die connectors 126. In some embodiments, the dielectric layer 132 is formed of a polymer, which may be a photo-sensitive material such as PBO, polyimide, BCB, or the like, that may be patterned using a lithography mask. In other embodiments, the dielectric layer 132 is formed of a nitride such as silicon nitride; an oxide such as silicon oxide, PSG, BSG, BPSG; or the like. The dielectric layer 132 may be formed by spin coating, lamination, CVD, the like, or a combination thereof.

Next, the dielectric layer 132 is then patterned. The patterning forms openings to expose portions of the through vias 112 and the die connectors 126. The patterning may be by an acceptable process, such as by exposing the dielectric layer 132 to light when the dielectric layer 132 is a photo-sensitive material or by etching using, for example, an anisotropic etch. If the dielectric layer 132 is a photo-sensitive material, the dielectric layer 132 can be developed after the exposure.

Next, metallization pattern 138 with vias is formed on the dielectric layer 132. As an example to form metallization pattern 138, a seed layer (not shown) is formed over the dielectric layer 132 and in openings through the dielectric layer 132. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 138. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 138 and vias. The vias are formed in openings through the dielectric layer 132 to, e.g., the through vias 112 and/or the die connectors 126.

This process may be repeated with dielectric layers 140 and 148, and metallization patterns and vias 146 and 154 to continue the formation of the redistribution structure 160. The materials and processes used to form these layers of the redistribution structure 160 may be similar to the dielectric layer 132 and metallization pattern and vias 138 and the description is not repeated herein.

After the formation of the metallization pattern and vias 154, the dielectric layer 156 is deposited on the metallization pattern 154 and the dielectric layer 148. In some embodiments, the dielectric layer 156 is formed of a polymer, which may be a photo-sensitive material such as PBO, polyimide, BCB, or the like, that may be patterned using a lithography mask. In other embodiments, the dielectric layer 156 is formed of a nitride such as silicon nitride; an oxide such as silicon oxide, PSG, BSG, BPSG; or the like. The dielectric layer 156 may be formed by spin coating, lamination, CVD, the like, or a combination thereof.

Next, the dielectric layer 156 is then patterned. The patterning forms openings to expose portions of the metallization pattern 154. The patterning may be by an acceptable process, such as by exposing the dielectric layer 156 to light when the dielectric layer is a photo-sensitive material or by etching using, for example, an anisotropic etch. If the dielectric layer 156 is a photo-sensitive material, the dielectric layer 156 can be developed after the exposure.

The front-side redistribution structure 160 is shown as an example. More or fewer dielectric layers and metallization patterns may be formed in the front-side redistribution structure 160. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Next, pads 162 are formed on an exterior side of the front-side redistribution structure 160. The pads 162 are used to couple to conductive connectors 166 (see FIG. 5) and may be referred to as under bump metallurgies (UBMs) 162. In the illustrated embodiment, the pads 162 are formed through openings through the dielectric layer 156 to the metallization pattern 154. As an example to form the pads 162, a seed layer (not shown) is formed over the dielectric layer 156. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 162. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 162. In the embodiment, where the pads 162 are formed differently, more photo resist and patterning steps may be utilized.

Figure 5:
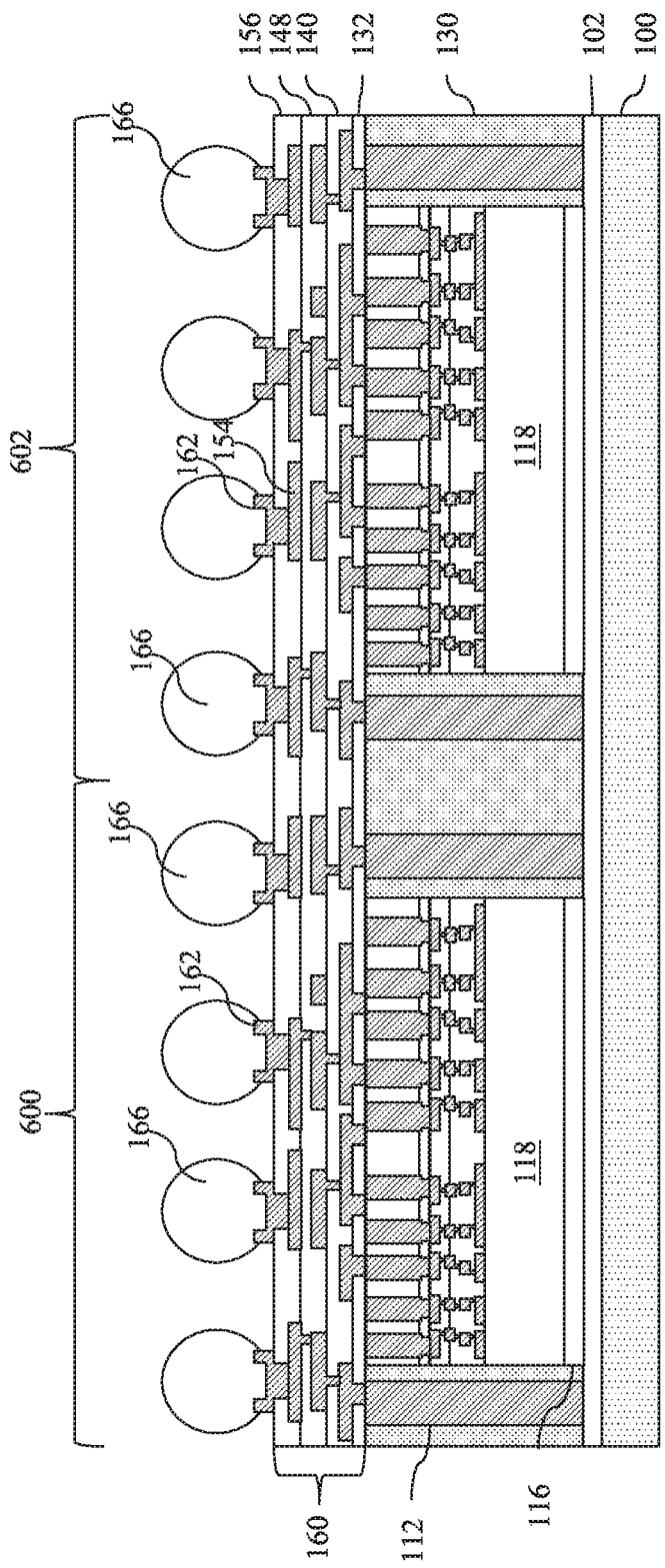

In FIG. 5, conductive connectors 166 are formed on the UBMs 162. The conductive connectors 166 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 166 may include a conductive material such as solder, copper, aluminum, gold, nickel, silver, palladium, tin, the like, or a combination thereof. In some embodiments, the conductive connectors 166 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 166 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 166. The metal cap layer may include nickel, tin, tin-lead, gold, silver, palladium, indium, nickel-palladium-gold, nickel-gold, the like, or a combination thereof and may be formed by a plating process.

Figure 6:
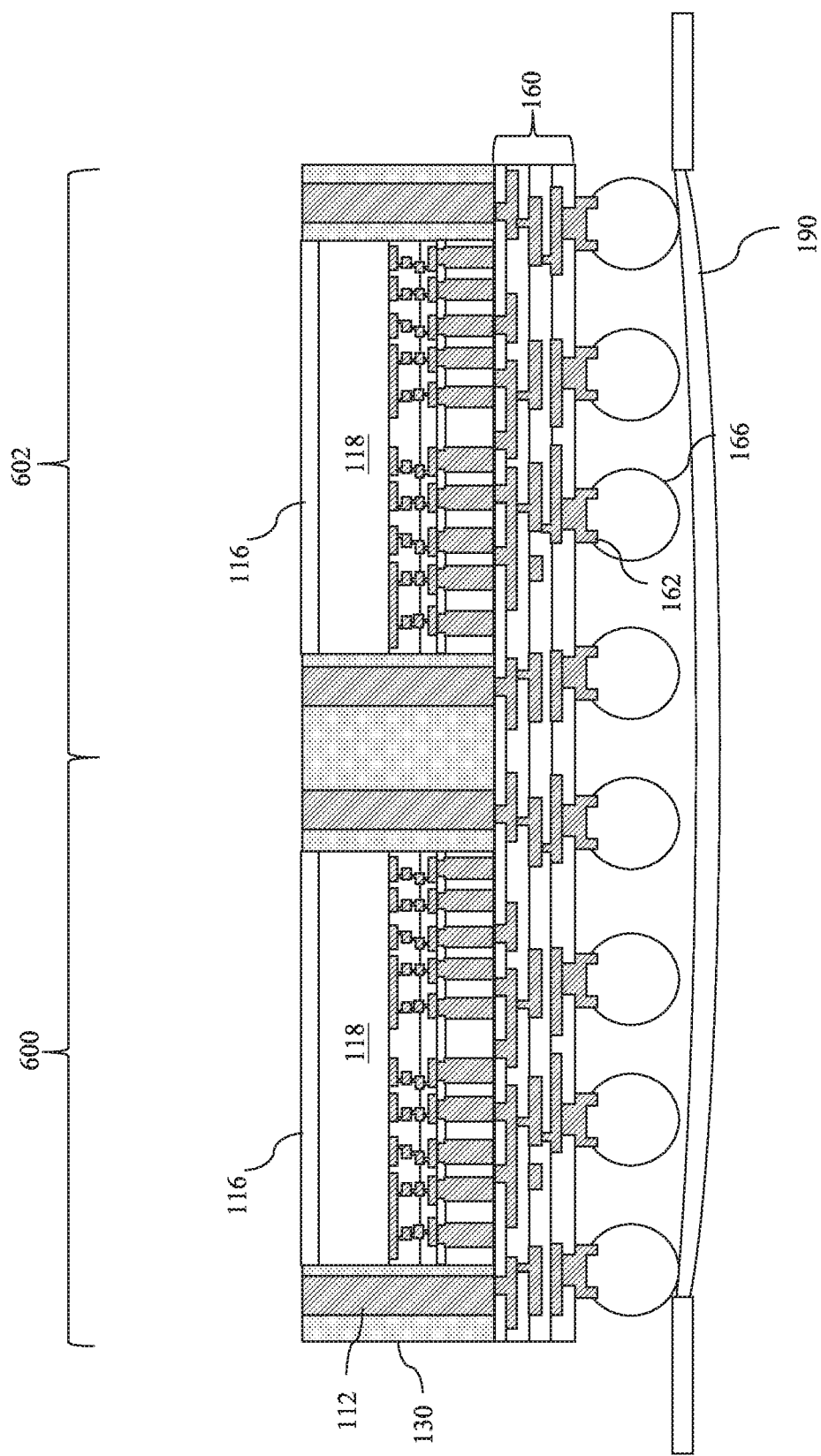

In FIG. 6, a carrier substrate de-bonding is performed to detach (de-bond) the carrier substrate 100 from the integrated circuit dies 114, the through vias 112, and the encapsulant 130. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 190.

As further illustrated in FIG. 6, ends of the through vias 112 are exposed. In some embodiments, an etching or cleaning may be performed to remove residue from the ends of the through vias 112.

Figure 7:
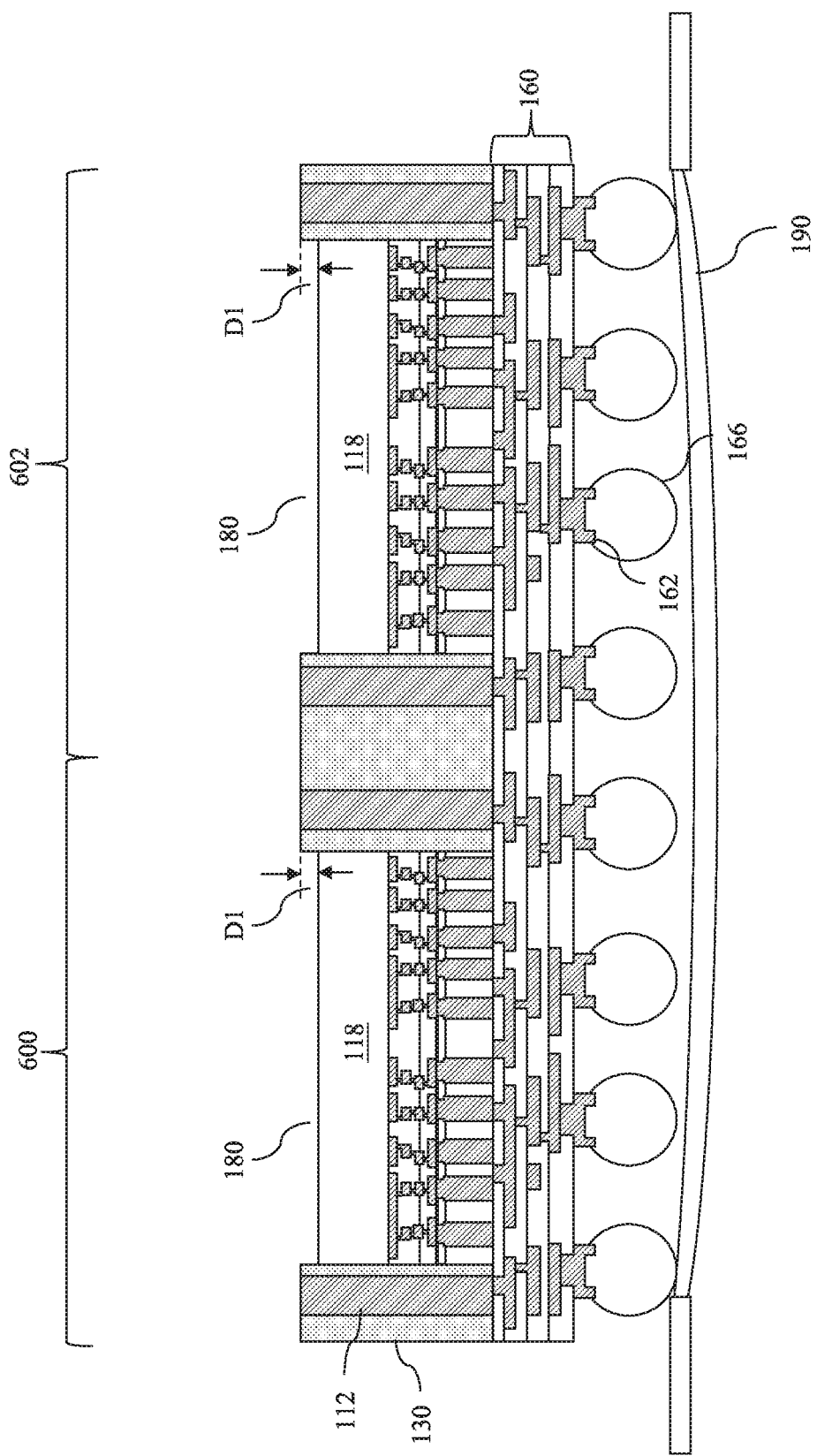

In FIG. 7, the adhesive 116 is removed to expose the back-sides of the integrated circuit dies 114, e.g., the back-sides of the substrates 118 of the integrated circuit dies 114. The adhesive 116 may be removed by any suitable process, such as peeling off the adhesive 116, projecting a light such as a laser light or an UV light on the adhesive layer 116 so that the adhesive layer 116 decomposes under the heat of the light, etching the adhesive 116, or the like.

The removal of the adhesive layers 116 forms recesses 180 over the back-sides of integrated circuit dies 114. The recesses 180 have a depth D1 as measured from a top surface of the encapsulant 130 to the exposed surface of the substrate 118 of the respective integrated circuit die 114. In some embodiments, the depths D1 of the recesses 180 are in a range from about 5 µm to about 30 µm.

Figure 8:
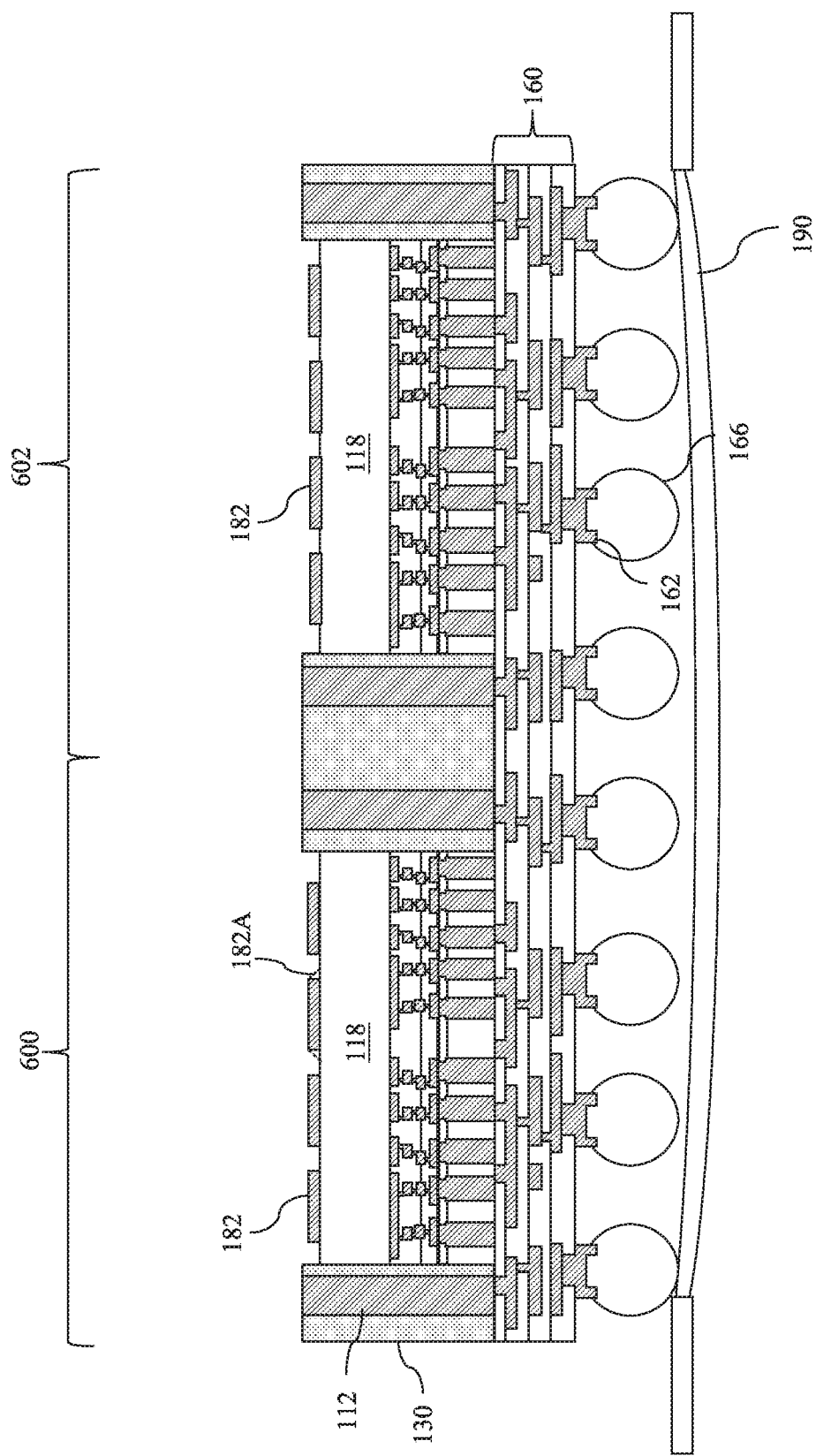

In FIG. 8, pads 182 are formed on the exposed surfaces of the substrates 118 of the integrated circuit dies 114. The pads 182 are not utilized to electrically connect devices or metallization patterns in integrated circuit dies 114 or package structures but are utilized to dissipate heat from the integrated circuit dies 114 and/or package structures. In some embodiments, the pads 182 may be referred to as thermal pads 182 that are utilized for dissipating heat from the integrated circuit dies 114. In some embodiments, the thermal pads 182 are not connected to thermal dissipation paths in the integrated circuit dies 114, while in some embodiments, the thermal pads 182 are connected to thermal dissipation paths in the integrated circuit dies 114 (see, e.g., FIG. 12).

The thermal pads 182 are also used to thermally connect to connectors 316 (see FIG. 9) and may be referred to as under bump metallurgies (UBMs) 182. In the illustrated embodiment, the thermal pads 182 are formed on the back-sides of the substrates 118 of the integrated circuit dies 114. As an example to form the thermal pads 182, a seed layer (not shown) is formed over the back-sides of the substrates 118. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the thermal pads 182. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the thermal pads 182. In the embodiment, where the thermal pads 182 are formed differently, more photo resist and patterning steps may be utilized.

For example, in another embodiment, the seed layer is formed over the back-sides of the substrates 118 and a conductive material is formed on the seed layer. The conductive material may be formed by plating, such as electroplating or electroless plating, or the like. The conductive material may comprise a metal, like copper, titanium, tungsten, aluminum, or the like. After the conductive material is formed, a mask may be formed and patterned over the conductive material corresponding to location of the thermal pads 182. In some embodiments, a photo resist or hard mask is used as the mask. After the mask is patterned, the exposed portions of the conductive material and seed layer (e.g. portions of the conductive material and seed layer not under the mask) are removed, such as by using an acceptable etching process, such as by wet or dry etching. The remaining portions of the seed layer and conductive material form the thermal pads 182. In this embodiment, the thermal pads 182 may have sidewalls 182A that are sloped (e.g., sidewalls that widen) from a top surface of the pad to the bottom surface of the pad. As illustrated in FIG. 8, the sloped sidewalls 182A of the thermal pads 182 mean that in that embodiment, the thermal pads 182 have larger bottom surfaces than top surfaces. Although the sloped sidewalls 182A are only illustrated on one of the thermal pads 182 in FIG. 8, in this embodiment, all of the thermal pads 182 will have the sloped sidewalls 182A.

In the prior embodiment, where the conductive material is formed within openings of a photo resist, the sidewalls of the thermal pads 182 may be substantially perpendicular to back-sides of the substrates 118.

In some embodiments, a UBM or pad (not shown) may be formed on the exposed ends of the through vias 112. This UBM or pad may be formed similarly to the thermal pads 182 and/or pads 162 described above and the description are not repeated herein.

Figure 9:
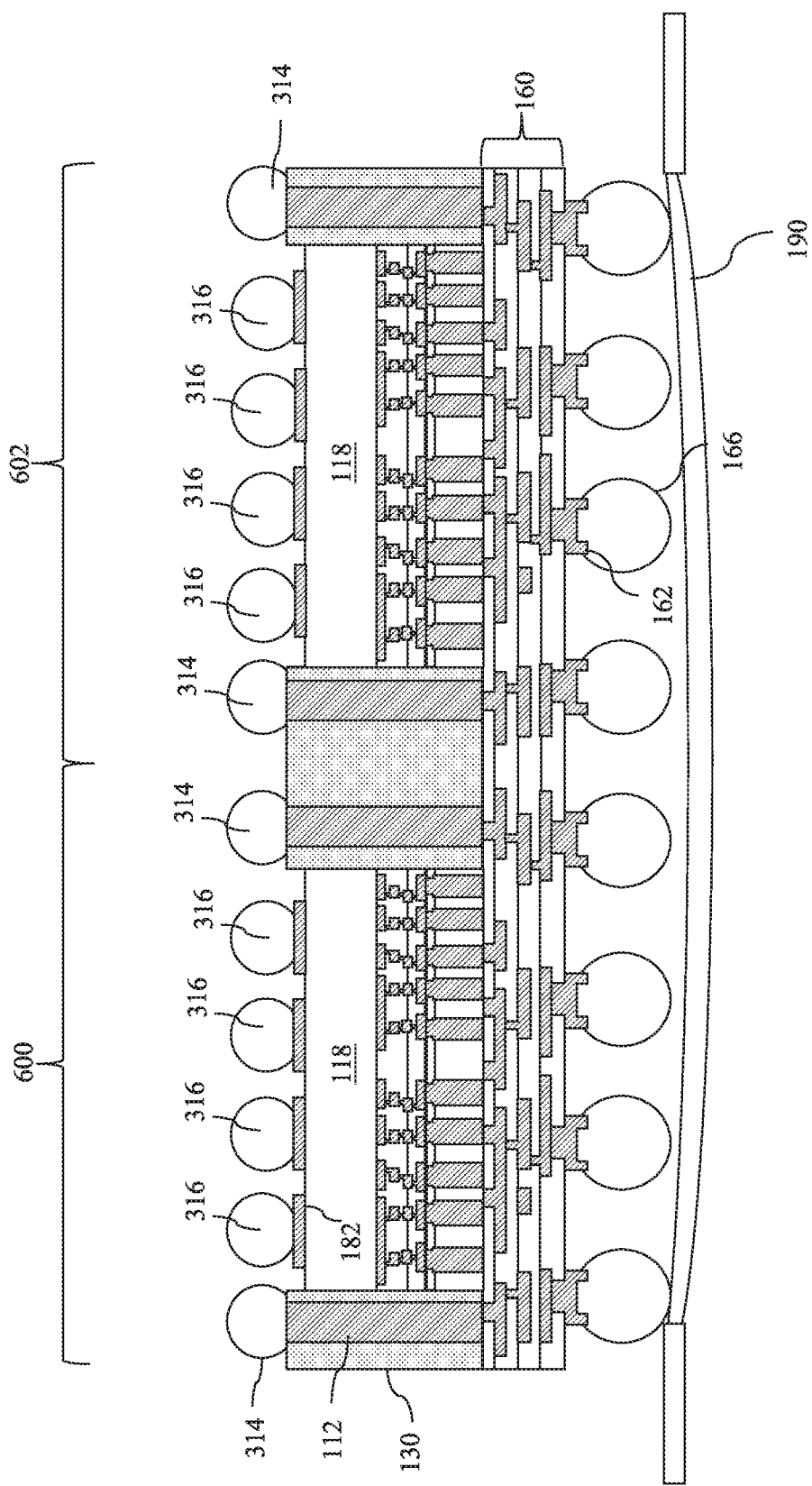

In FIG. 9, conductive connectors 314 and 316 are formed over and connected to the through vias 112 and thermal pads 182, respectively. The conductive connectors 314 are utilized to electrically connect the package structure of FIG. 9 to other package structures (e.g. package structure 300 in FIG. 10). Similar to the thermal pads 182, the conductive connectors 316 are not utilized to electrically connect devices or metallization patterns in integrated circuit dies 114 or package structures but are utilized to dissipate heat from the integrated circuit dies 114 and/or package structures. Hence, the conductive connectors 316 may be referred to as thermal connectors 316 hereinafter. By utilizing the thermal pads 182 and the thermal connectors 316, the thermal resistance (° C./Watt) of the package structure can be improved by up to about 8% over package structures that do not include the thermal pads and thermal connectors.

The conductive connectors 314 and thermal connectors 316 may be BGA connectors, solder balls, metal pillars, C4 bumps, micro bumps, ENEPIG formed bumps, or the like. The conductive connectors 314 and thermal connectors 316 may include a conductive material such as solder, copper, aluminum, gold, nickel, silver, palladium, tin, the like, or a combination thereof. In some embodiments, the conductive connectors 314 and thermal connectors 316 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 314 and thermal connectors 316 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 316 and 316. The metal cap layer may include nickel, tin, tin-lead, gold, silver, palladium, indium, nickel-palladium-gold, nickel-gold, the like, or a combination thereof and may be formed by a plating process.

Figure 10:
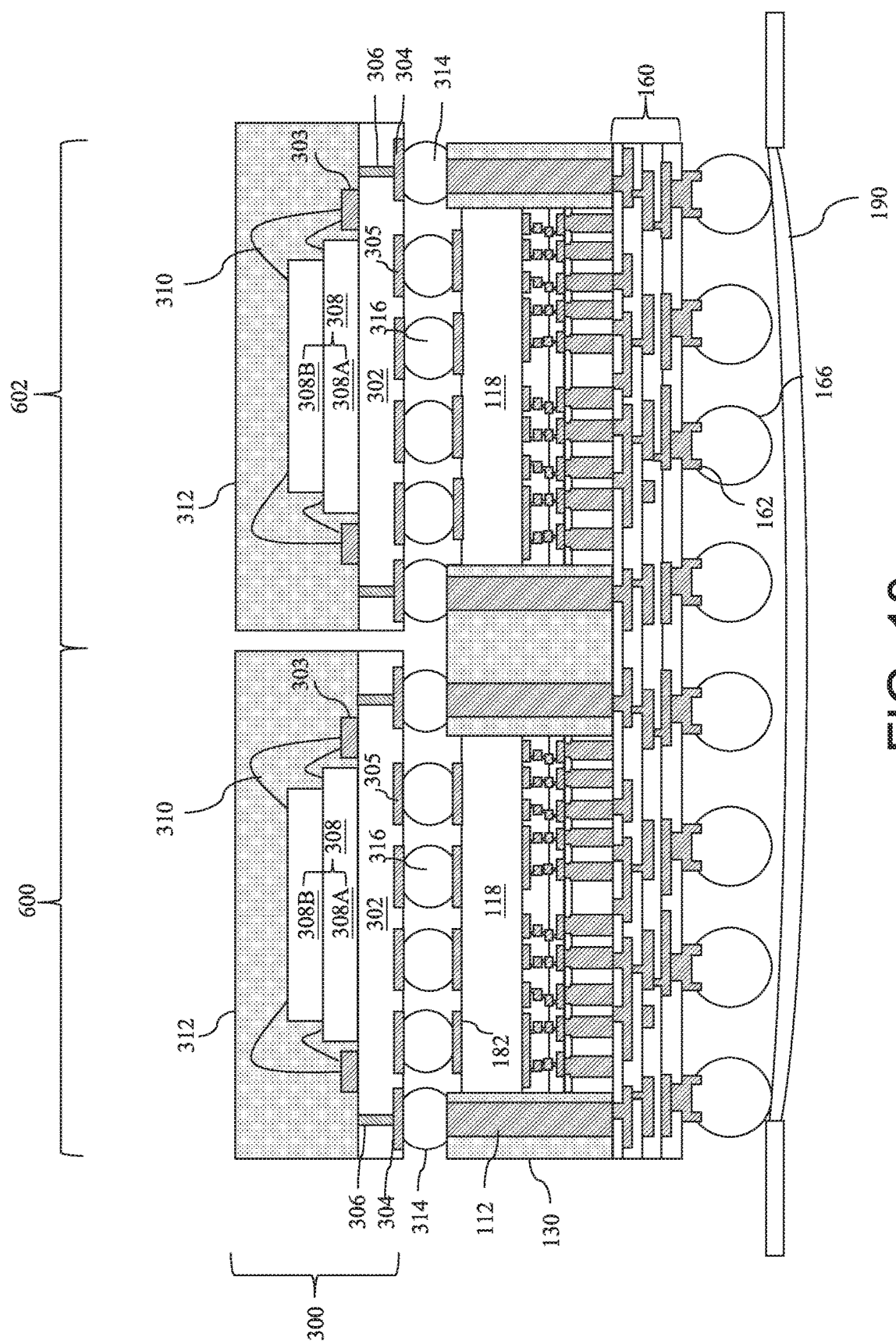

In FIG. 10, package structures 300 are bonded to the package structure of FIG. 9 with the conductive connectors 314 and the thermal connectors 316. The package structures 300 include a substrate 302 and one or more stacked dies 308 (308A and 308B) coupled to the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrates 302 may include active and passive devices (not shown in FIG. 10). As one of ordinary skill in the art will recognize, a wide variety of devices such as transistors, capacitors, resistors, combinations of these, and the like may be used to generate the structural and functional requirements of the design for the semiconductor package 300. The devices may be formed using any suitable methods.

The substrates 302 may also include metallization layers (not shown) and through vias 306. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrates 302 may have bond pads 303 on a first side the substrates 302 to couple to the stacked dies 308, and bond pads 304 and thermal pads 305 on a second side of the substrate 302, the second side being opposite the first side of the substrate 302, to couple to the connectors 314 and 316. In some embodiments, the thermal pads 305 are omitted. In some embodiments, the bond pads 303 and 304 and thermal pads 305 are formed by forming recesses (not shown) into dielectric layers (not shown) on the first and second sides of the substrate 302. The recesses may be formed to allow the bond pads 303 and 304 and thermal pads 305 to be embedded into the dielectric layers. In other embodiments, the recesses are omitted as bond pads 303 and 304 and thermal pads 305 may be formed on the dielectric layer. In some embodiments, the bond pads 303 and 304 and thermal pads 305 include a thin seed layer (not shown) made of copper, titanium, nickel, gold, palladium, the like, or a combination thereof. The conductive material of the bond pads 303 and 304 and thermal pads 305 may be deposited over the thin seed layer. The conductive material may be formed by an electro-chemical plating process, an electroless plating process, CVD, ALD, PVD, the like, or a combination thereof. In an embodiment, the conductive material of the bond pads 303 and 304 and thermal pads 305 is copper, tungsten, aluminum, silver, gold, the like, or a combination thereof.

In an embodiment, the bond pads 303 and 304 and thermal pads 305 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 303, 304, and 305. Any suitable materials or layers of material that may be used for the UBMs 303, 304, and 305 are fully intended to be included within the scope of the current application. In some embodiments, the through vias 306 extend through the substrate 302 and couple at least one bond pad 303 to at least one bond pad 304.

In the illustrated embodiment, the stacked dies 308 are coupled to the substrate 302 by wire bonds 310, although other connections may be used, such as conductive bumps. In an embodiment, the stacked dies 308 are stacked memory dies. For example, the stacked memory dies 308 may include low-power (LP) double data rate (DDR) memory modules, such as LPDDR1, LPDDR2, LPDDR3, LPDDR4, or the like memory modules.

In some embodiments, the stacked dies 308 and the wire bonds 310 may be encapsulated by a molding material 312. The molding material 312 may be molded on the stacked dies 308 and the wire bonds 310, for example, using compression molding. In some embodiments, the molding material 312 is a molding compound, a polymer, an epoxy, silicon oxide filler material, the like, or a combination thereof. A curing step may be performed to cure the molding material 312, wherein the curing may be a thermal curing, a UV curing, the like, or a combination thereof.

In some embodiments, the stacked dies 308 and the wire bonds 310 are buried in the molding material 312, and after the curing of the molding material 312, a planarization step, such as a grinding, is performed to remove excess portions of the molding material 312 and provide a substantially planar surface for the second packages 300.

After the second packages 300 are formed, the packages 300 are bonded to the first packages 200 by way of conductive connectors 314, the bond pads 304, and the through vias 112. In some embodiments, the stacked memory dies 308 may be coupled to the integrated circuit dies 114 through the wire bonds 310, the bond pads 303 and 304, through vias 306, the conductive connectors 314, the through vias 112, and the redistribution structure 160.

In some embodiments, before bonding the conductive connectors 314 and thermal connectors 316, the conductive connectors 314 and thermal connectors 316 are coated with a flux (not shown), such as a no-clean flux. The conductive connectors 314 and thermal connectors 316 may be dipped in the flux or the flux may be jetted onto the conductive connectors 314 and thermal connectors 316. In another embodiment, the flux may be applied to the exposed surfaces of the through vias 112.

In some embodiments, the conductive connectors 314 and thermal connectors 316 may have an epoxy flux (not shown) formed thereon before they are reflowed with at least some of the epoxy portion of the epoxy flux remaining after the upper package 300 is attached to the lower package. This remaining epoxy portion may act as an underfill to reduce stress and protect the joints resulting from the reflowing the conductive connectors 314 and thermal connectors 316. In some embodiments, an underfill (not shown in FIG. 10 but see underfill 320 in FIG. 11) may be formed between the upper package 300 and the lower package and surrounding the conductive connectors 314 and thermal connectors 316. The underfill 320 may be any acceptable material, such as a polymer, epoxy, molding underfill, or the like. The underfill 320 may be formed by a capillary flow process after the upper package 300 is attached or may be formed by a suitable deposition method before the upper package 300 is attached.

The bonding between the upper packages 300 and the lower package may be a solder bonding or a direct metal-to-metal (such as a copper-to-copper or tin-to-tin) bonding. In an embodiment, the upper packages 300 are bonded to lower package by a reflow process. During this reflow process, the conductive connectors 314 are in contact with the bond pads 304 and the through vias 112 to physically and electrically connect the upper packages 300 to the lower package. In addition, during the reflow process, the thermal connectors 316 are in contact with the thermal pads 305 (if present) and the thermal pads 182 to physically and thermally connect integrated circuit dies 114 and the thermal pads 182, thermal connectors 316, and thermal pads 305. After the bonding process, an intermetallic compound (IMC) (not shown) may form at the interface of the through vias 112 and the conductive connectors 314 and the thermal pads 182 and thermal connectors 316. In addition, an IMC (not shown) may be also formed so at the interface between the conductive connectors 314 and the bond pads 304 and the thermal connectors 316 and the thermal pads 305.

Figure 11:
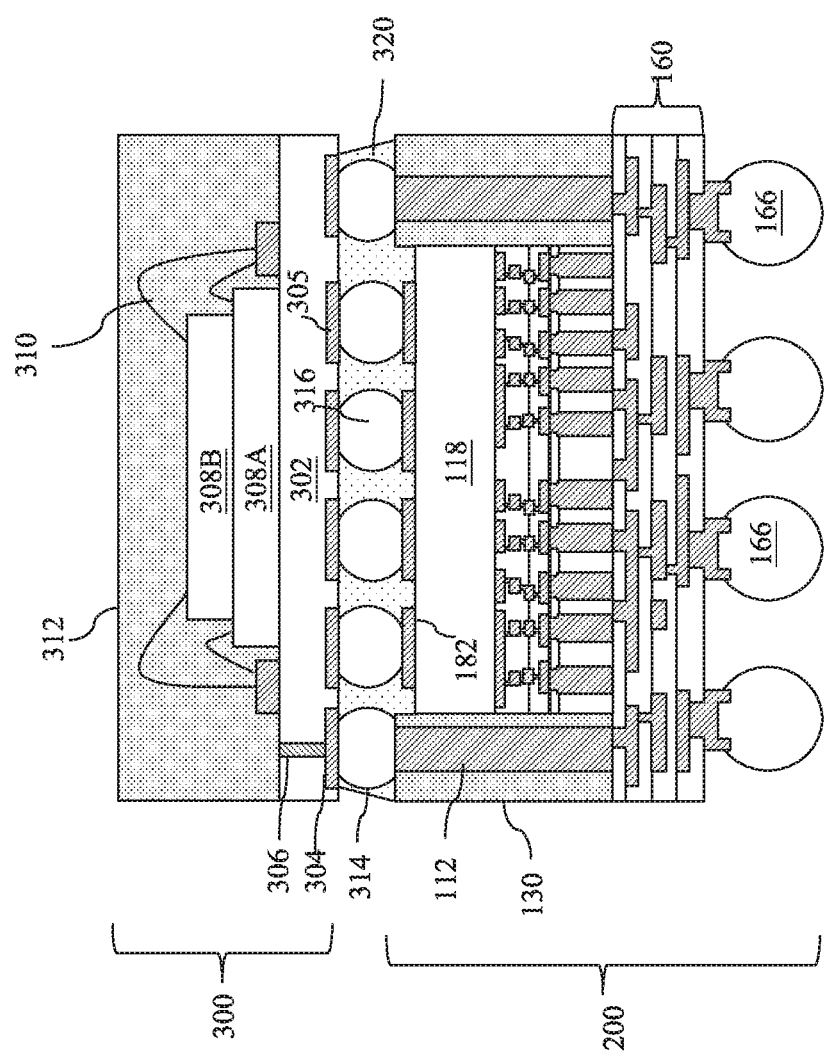

In FIG. 11, the lower package is singulated into multiple lower packages 200. A singulation process may be performed by sawing along scribe line regions e.g., between adjacent regions 600 and 602. In some embodiments, the singulation process includes sawing, laser singulation, etching, or the like. The singulation process separates the first package region 600 from the second package region 602. FIG. 11 illustrates a resulting, singulated package 200, which may be from one of the first package region 600 or the second package region 602. The package 200 may also be referred to as an integrated fan-out (InFO) package 200.

Figure 12:
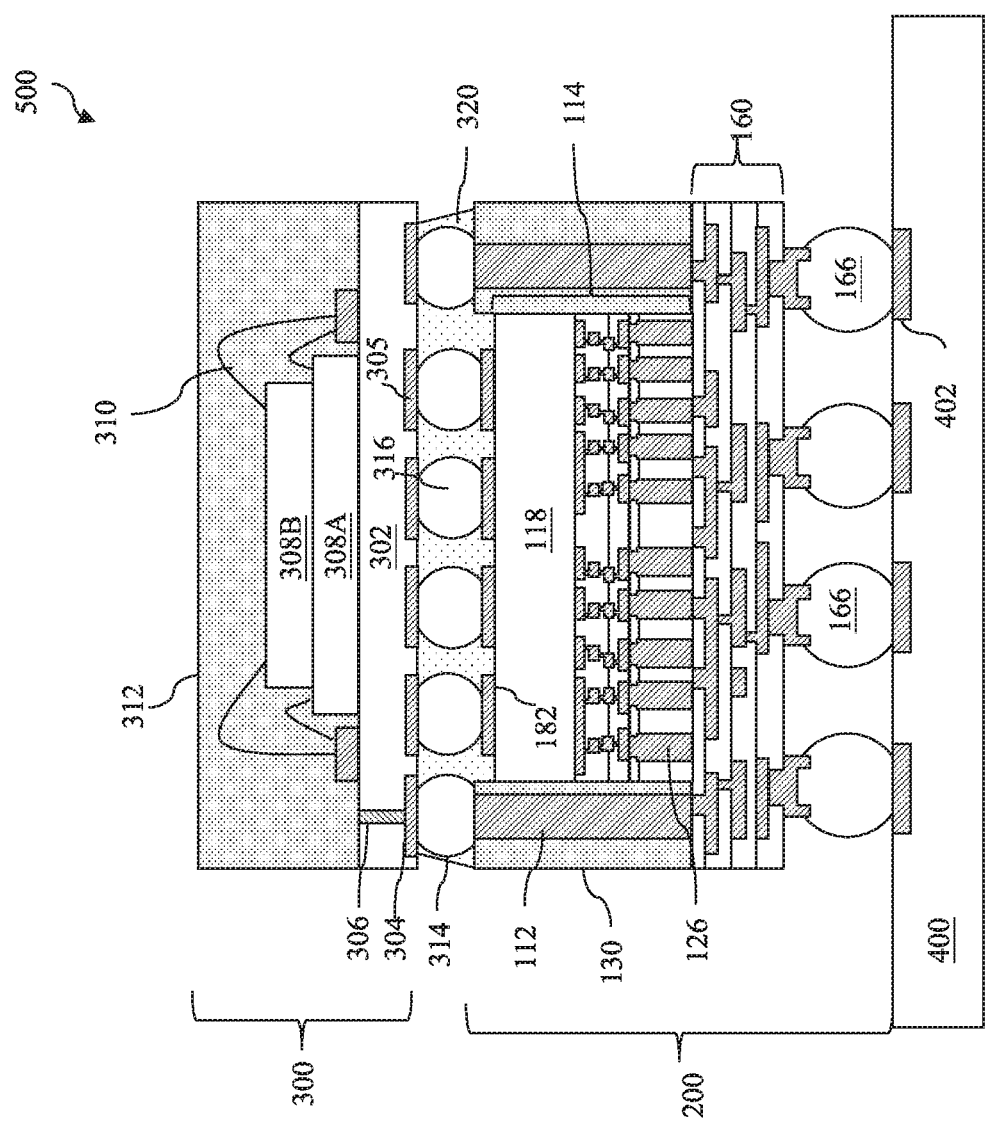

FIG. 12 illustrates a semiconductor package 500 including the package 200 (may be referred to as a first package 200), the package 300 (may be referred to as a second package 300), and a substrate 400.

The semiconductor package 500 includes the packages 200 and 300 being mounted to a substrate 400. The substrate 400 may be referred to a package substrate 400. The package 200 is mounted to the package substrate 400 using the conductive connectors 166.

The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 400.

The package substrate 400 may include active and passive devices (not shown in FIG. 12). As one of ordinary skill in the art will recognize, a wide variety of devices such as transistors, capacitors, resistors, combinations of these, and the like may be used to generate the structural and functional requirements of the design for the semiconductor package 500. The devices may be formed using any suitable methods.

The package substrate 400 may also include metallization layers and vias (not shown) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

In some embodiments, the conductive connectors 166 can be reflowed to attach the package 200 to the bond pads 402. The conductive connectors 166 electrically and/or physically couple the substrate 400, including metallization layers in the substrate 400, to the first package 200.

The conductive connectors 166 may have an epoxy flux (not shown) formed thereon before they are reflowed with at least some of the epoxy portion of the epoxy flux remaining after the package 200 is attached to the substrate 400. This remaining epoxy portion may act as an underfill to reduce stress and protect the joints resulting from the reflowing the conductive connectors 166. In some embodiments, an underfill (not shown) may be formed between the first package 200 and the substrate 400 and surrounding the conductive connectors 166. The underfill may be formed by a capillary flow process after the package 200 is attached or may be formed by a suitable deposition method before the package 200 is attached.

Figure 13A:
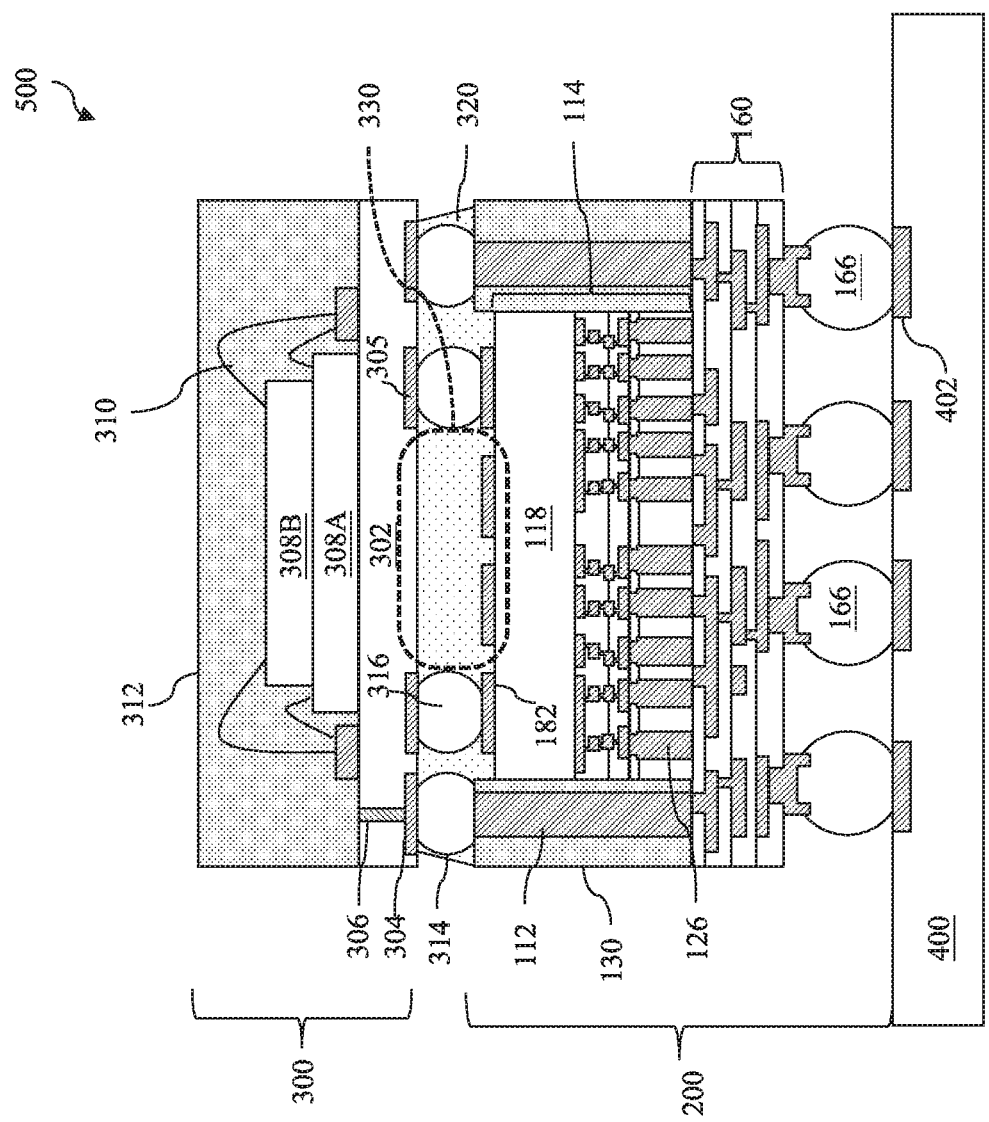
FIGS. 13A and 13B illustrates a cross-sectional view and a plan view of a another package structure in accordance with some embodiments.
Figure 13B:
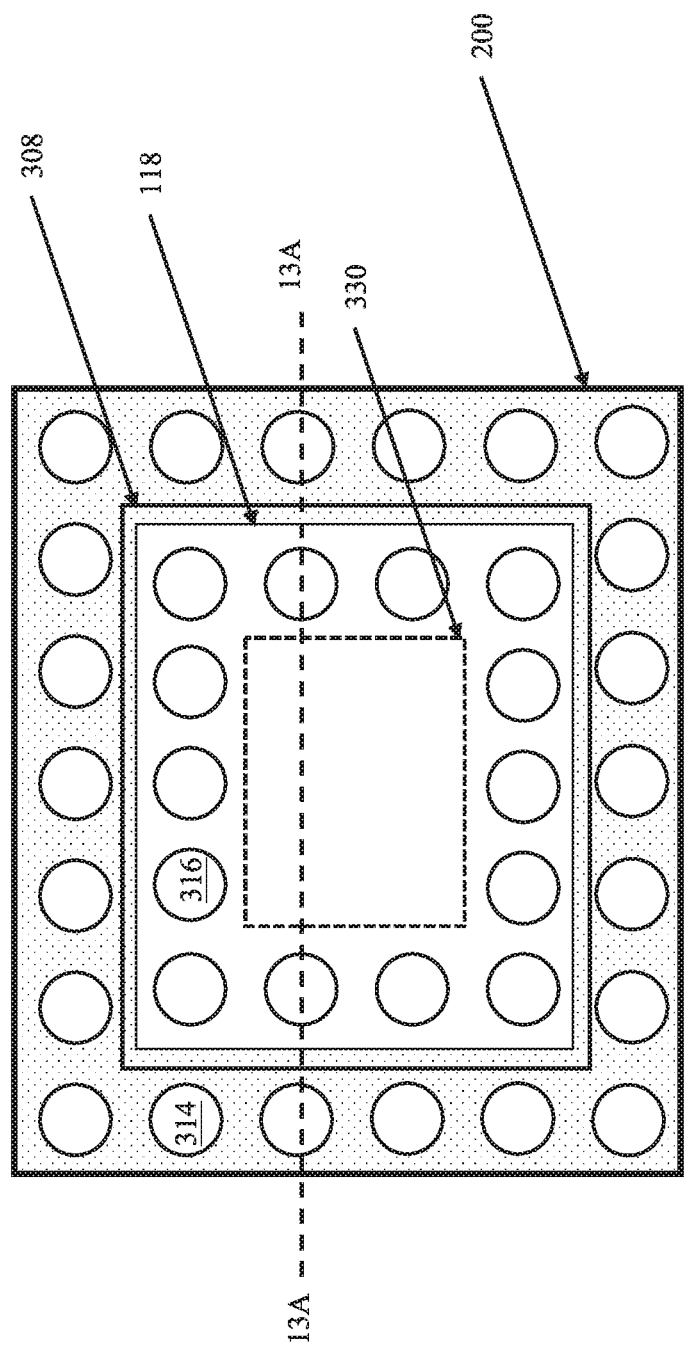

FIGS. 13A and 13B illustrates a cross-sectional view and a plan view of a another package structure in accordance with some embodiments. The embodiment in FIGS. 13A and 13B is similar to the embodiment illustrated in FIGS. 1 through 12 except that this embodiment includes an area 330 between the packages 200 and 300 that is free of conductive connectors 314. Details regarding this embodiment that are similar to those for the previously described embodiment will not be repeated herein.

In this embodiment, the area 330 between the packages 200 and 300 that is free of conductive connectors 314. As illustrated in the plan view of FIG. 13B, the area 330 is within the footprint 308 of one or more of the dies 308 of the package 300. This helps to reduce the temperature of the dies 308 during operation as they do not receive as much of the heat dissipated from the dies 114 of the package 200. The area 330 could be in a central region of the packages in a plan view. In some embodiments, the area 330 is in a peripheral region of the packages in a plan view, and in some embodiments, the area 330 is both in a central region and a peripheral region. By removing some of the conductive connectors 314 within the footprint 308 of one or more of the dies 308, the temperature of the dies 308 during operation can be reduced.

The area 330 that is free of conductive connectors 314 of this embodiment can be included the packages of the other disclosed embodiments of this disclosure.

Figure 14:
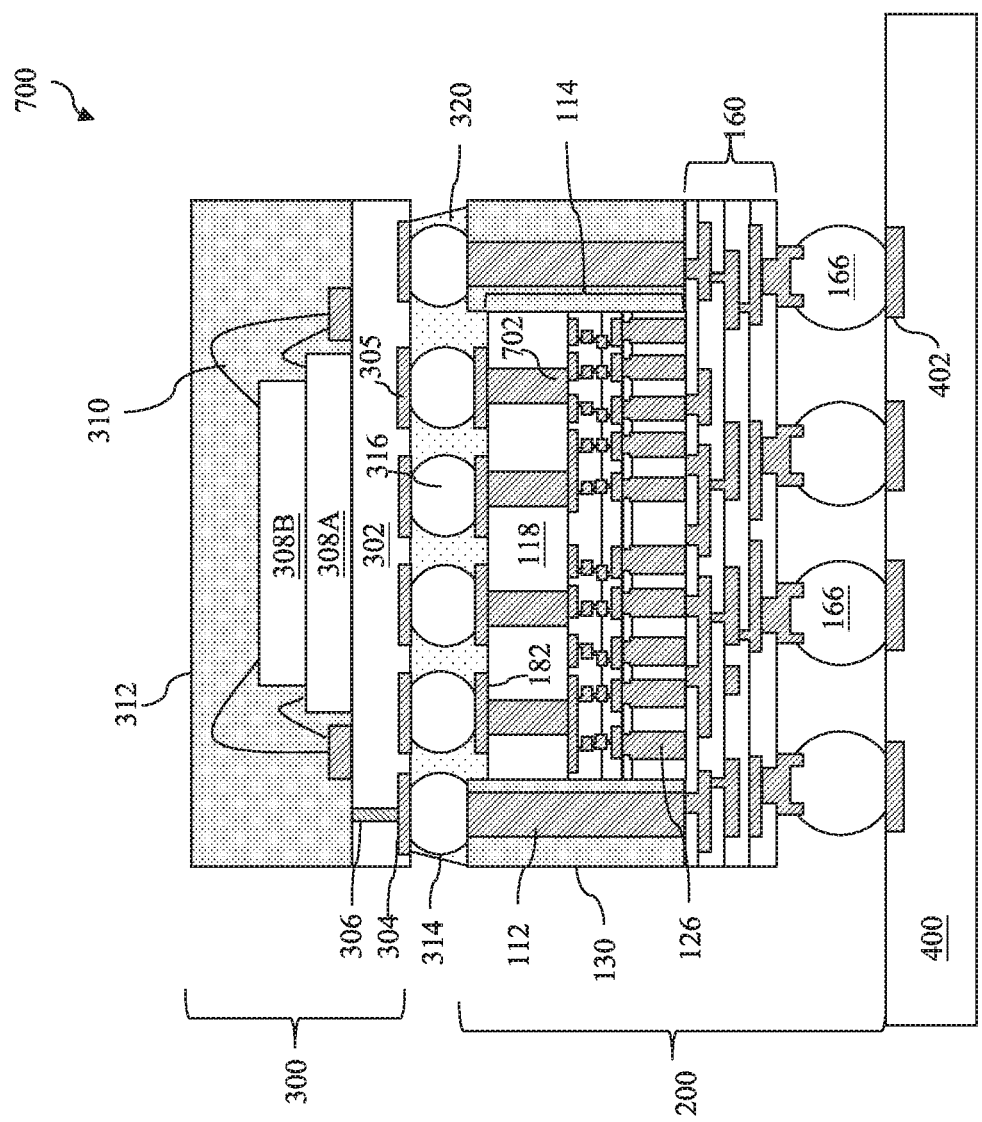
FIG. 14 illustrates a cross-sectional view of another package structure in accordance with some embodiments.

FIG. 14 illustrates a cross-sectional view of a package structure in accordance with some embodiments. The embodiment in FIG. 14 is similar to the embodiment illustrated in FIGS. 1 through 12 except that this embodiment includes vias 702 in the substrate 118 of the integrated circuit die 114. Details regarding this embodiment that are similar to those for the previously described embodiment will not be repeated herein.

In this embodiment, the integrated circuit die 114 can have one or more vias 702 formed in the substrate 118 to aid in the dissipation of heat from the devices within the integrated circuit die. For example, the vias 702 can be thermally connected to a transistor in the integrated circuit die 114 to allow the heat generated by the transistor to more easily be removed from the integrated circuit die 114. The vias 702 can further improve the heat dissipation of the other embodiments of this disclosure. The thermal pads 182 can be physically connected to the vias 702 to aid in dissipating the heat from the devices within the integrated circuit die 114.

In some embodiments, the vias 702 are formed partially through the substrates 118 of the integrated circuit dies 114, and, in some embodiments, the vias 702 are formed substantially through the substrates 118 of the integrated circuit dies 114.

The vias 702 may be formed in the integrated circuit dies 114 before the integrated circuit dies 114 are attached to the carrier (see, e.g., FIG. 2). The vias 702 may be formed by forming openings in the substrate 118 of the integrated circuit die 114 and then filling the openings with a conductive material. The openings may be formed by acceptable photolithography and etching techniques. After the openings are formed, a liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, cobalt, or the like. A planarization process, such as a chemical mechanical polishing process (CMP), may be performed to remove excess material from a surface of the substrate 118. The remaining liner and conductive material form contacts the vias 702 in the openings.

The thermal pads 182 are then formed on the back-side of the substrate 118 of the integrated circuit die 114 and are physically contacting the vias 702. The thermal pads 182 may be formed as described above in the previous embodiment and the description is not repeated herein.

The vias 702 of this embodiment can be included the dies and dummy dies of the other disclosed embodiments of this disclosure.

FIGS. 15 through 18 illustrate cross-sectional views of intermediate steps during a process for a third package structure in accordance with some embodiments. The embodiment in FIGS. 14 through 17 is similar to the embodiments illustrated in FIGS. 1 through 12 except that in this embodiment thermal pads 712 are formed on the back-sides of the substrate 118 of the integrated circuit die 114 before the integrated circuit die 114 is attached to the carrier substrate 100. Details regarding this embodiment that are similar to those for the previously described embodiment will not be repeated herein.

Figure 15:
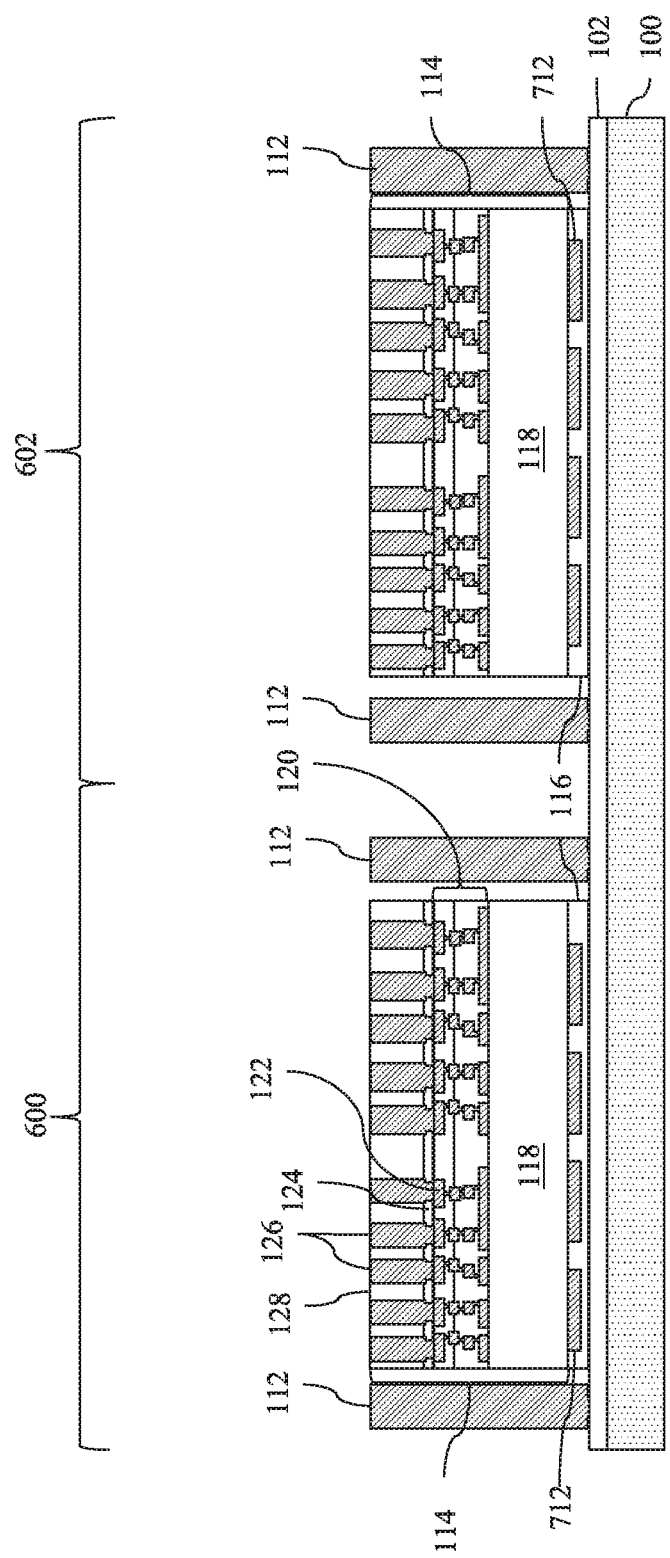
FIGS. 15 through 18 illustrate cross-sectional views of intermediate steps during a process for another package structure in accordance with some embodiments.

FIG. 15 illustrates an equivalent intermediate stage of processing as FIG. 2 described above and the description is not repeated herein. In FIG. 15, the thermal pads 712 are formed as a part of the formation process of the integrated circuit dies 114. For example, the thermal pads 712 can be formed similar to a back-side redistribution structure for the integrated circuit dies 114 before the adhesive 116 is formed over the back-sides of the substrates 118 of the integrated circuit dies 114.

The thermal pads 712 are formed on the back-side surface of the substrates 118 of the integrated circuit dies 114. The thermal pads 712 are not utilized to electrically connect devices or metallization patterns in integrated circuit dies 114 or package structures but are utilized to dissipate heat from the integrated circuit dies 114 and/or package structures. In some embodiments, the thermal pads 712 are not connected to thermal dissipation paths in the integrated circuit dies 114, while in some embodiments, the thermal pads 182 are connected to thermal dissipation paths in the integrated circuit dies 114 (see, e.g., FIG. 12).

The thermal pads 712 are also used to physically and thermally connect to connectors 316 (see, e.g., FIG. 18) and may be referred to as UBMs 712. In the illustrated embodiment, the thermal pads 712 are formed on the back-sides of the substrates 118 of the integrated circuit dies 114. As an example to form the thermal pads 712, a seed layer (not shown) is formed over the back-sides of the substrates 118. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the thermal pads 712. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the thermal pads 712. In the embodiment, where the thermal pads 712 are formed differently, more photo resist and patterning steps may be utilized.

Figure 16:
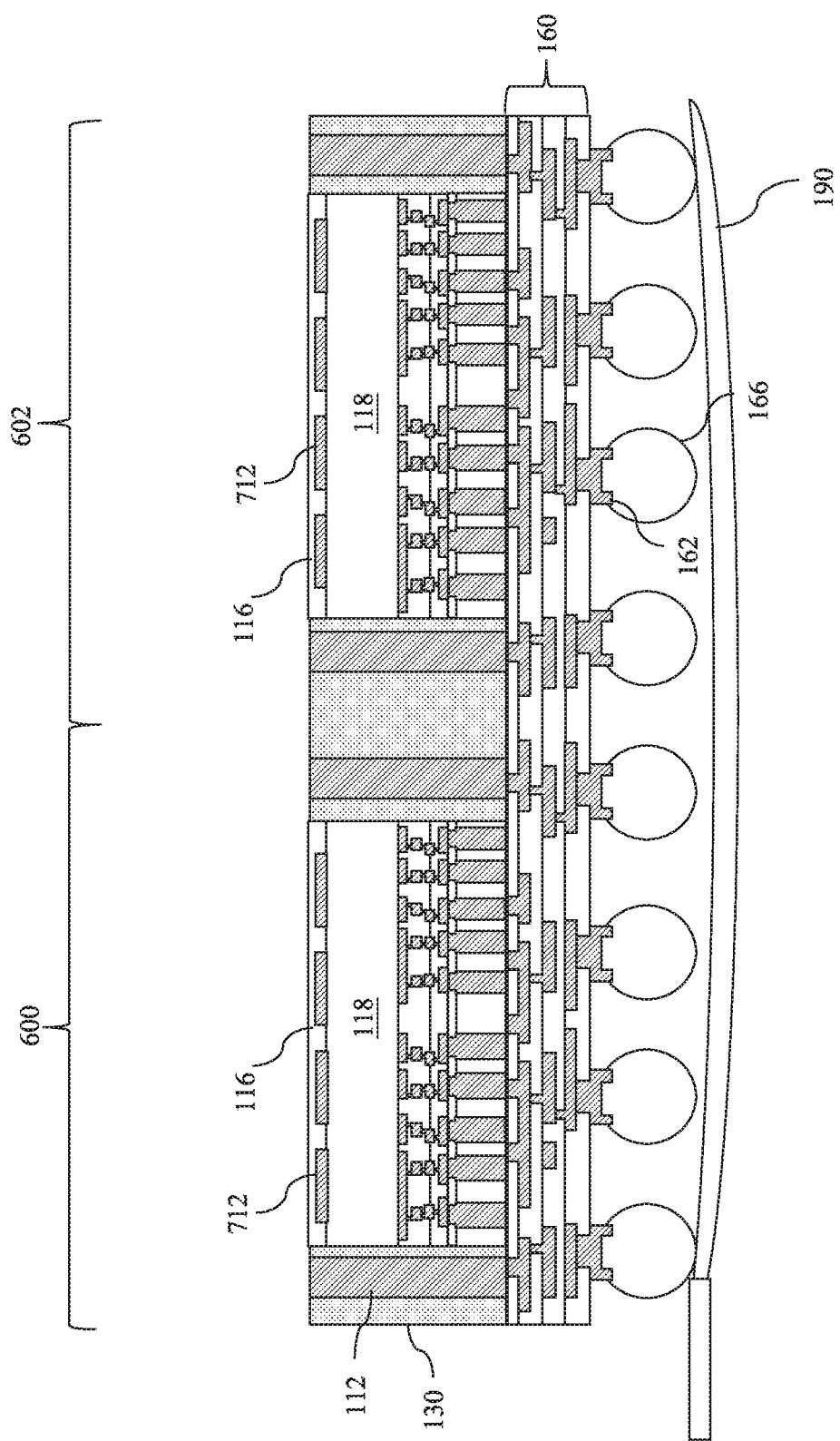

FIG. 16 illustrates further processing on the structure of FIG. 15. The processing between these two figures is similar to the processing illustrated and described above in reference to FIGS. 3 through 6 with FIG. 6 being an equivalent intermediate stage as FIG. 16 and the descriptions are not repeated herein.

Figure 17:
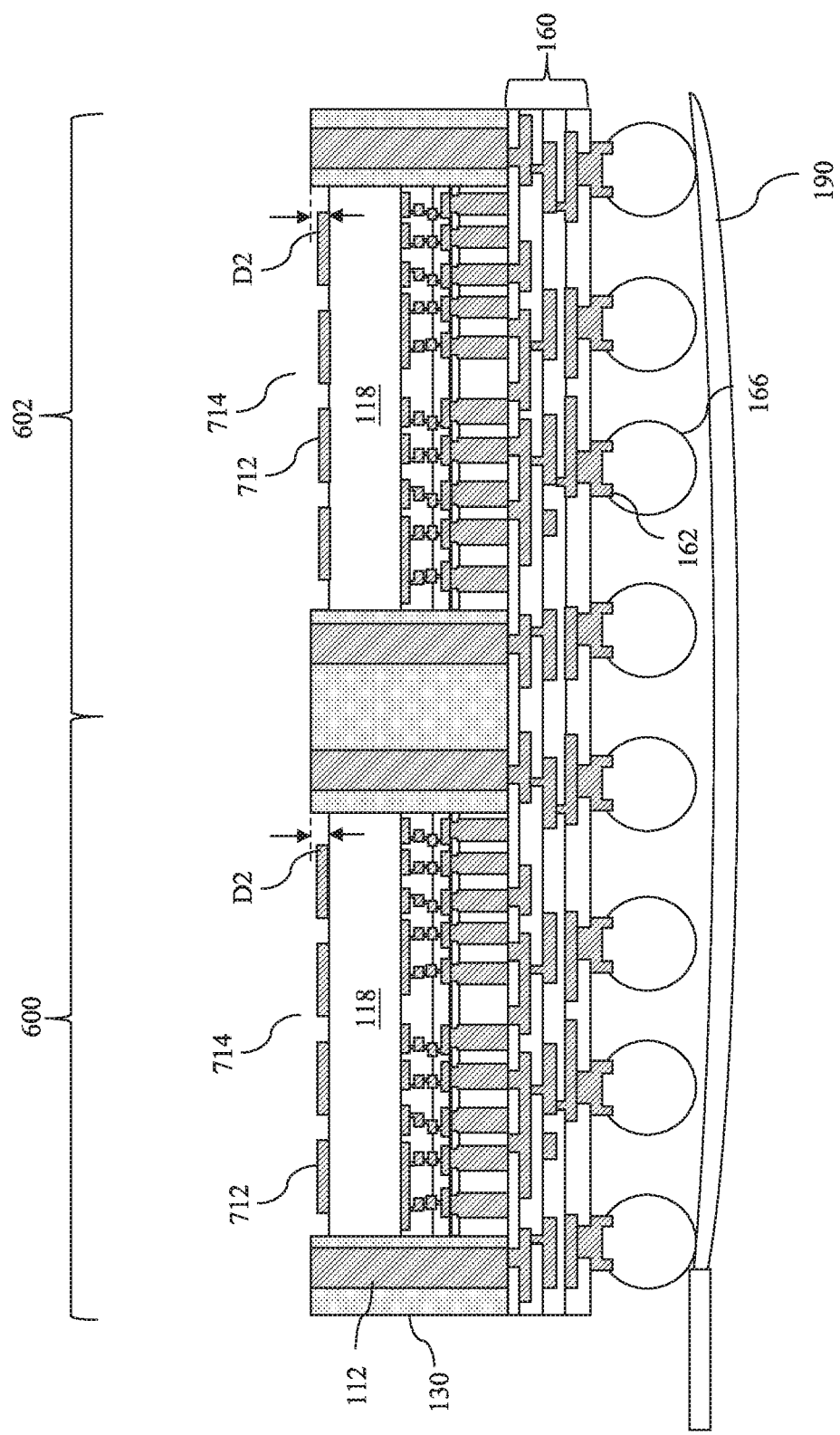

In FIG. 17, the adhesive 116 is removed to expose the thermal pads 712 and the back-sides of the integrated circuit dies 114, e.g., the back-sides of the substrates 118 of the integrated circuit dies 114. The adhesive 116 may be removed by any suitable process, such as peeling off the adhesive 116, projecting a light such as a laser light or an UV light on the adhesive layer 116 so that the adhesive layer 116 decomposes under the heat of the light, etching the adhesive 116, or the like.

The removal of the adhesive layers 116 forms recesses 714 over the back-sides of integrated circuit dies 114. The recesses 714 have a depth D2 as measured from a top surface of the encapsulant 130 to the exposed surface of the substrate 118 of the respective integrated circuit die 114. In some embodiments, the depths D2 of the recesses 714 are in a range from about 5 µm to about 30 µm.

Figure 18:
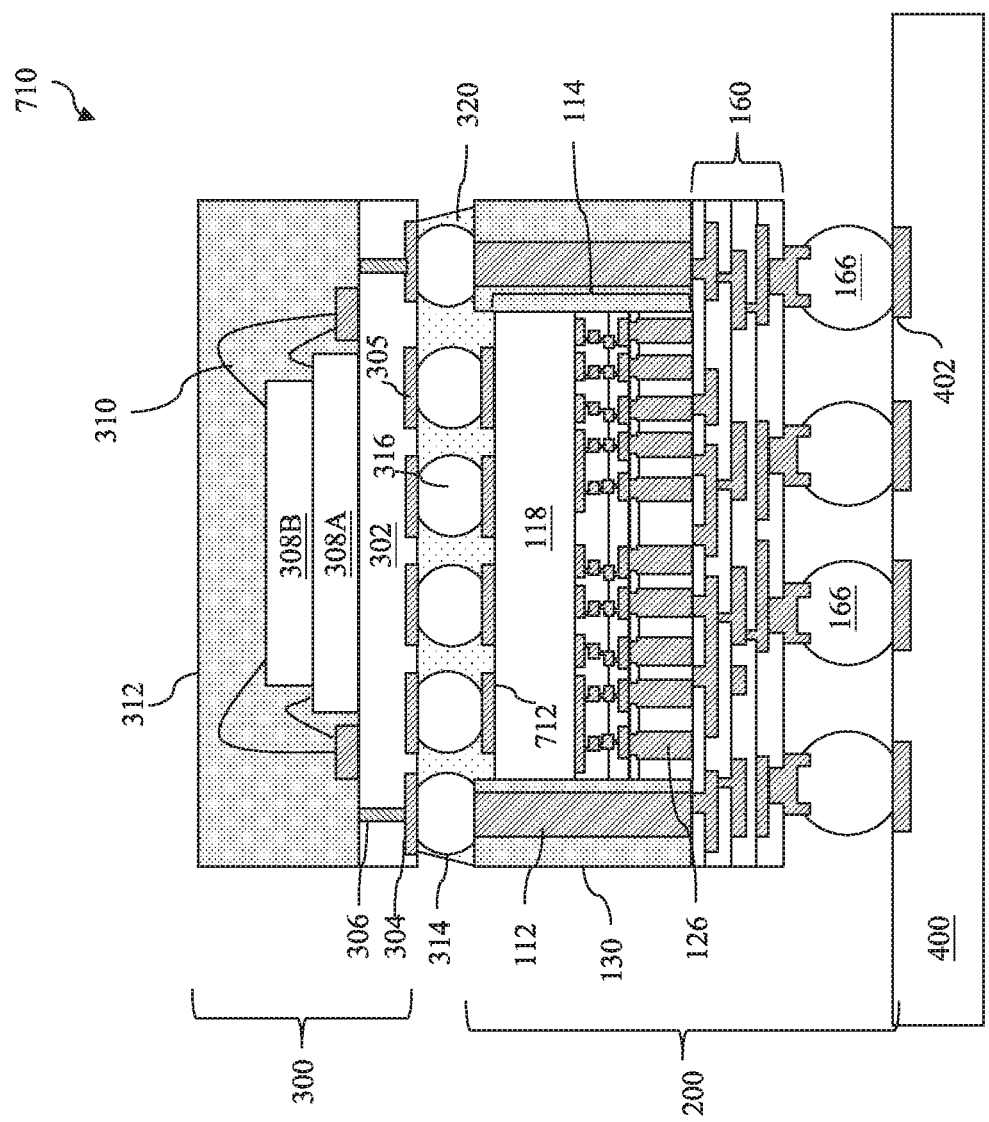

FIG. 18 illustrates further processing on the structure of FIG. 17. The processing between these two figures is similar to the processing illustrated and described above in reference to FIGS. 9 through 12 with FIG. 12 being an equivalent stage of manufacture as FIG. 18 and the descriptions are not repeated herein.

Figure 19:
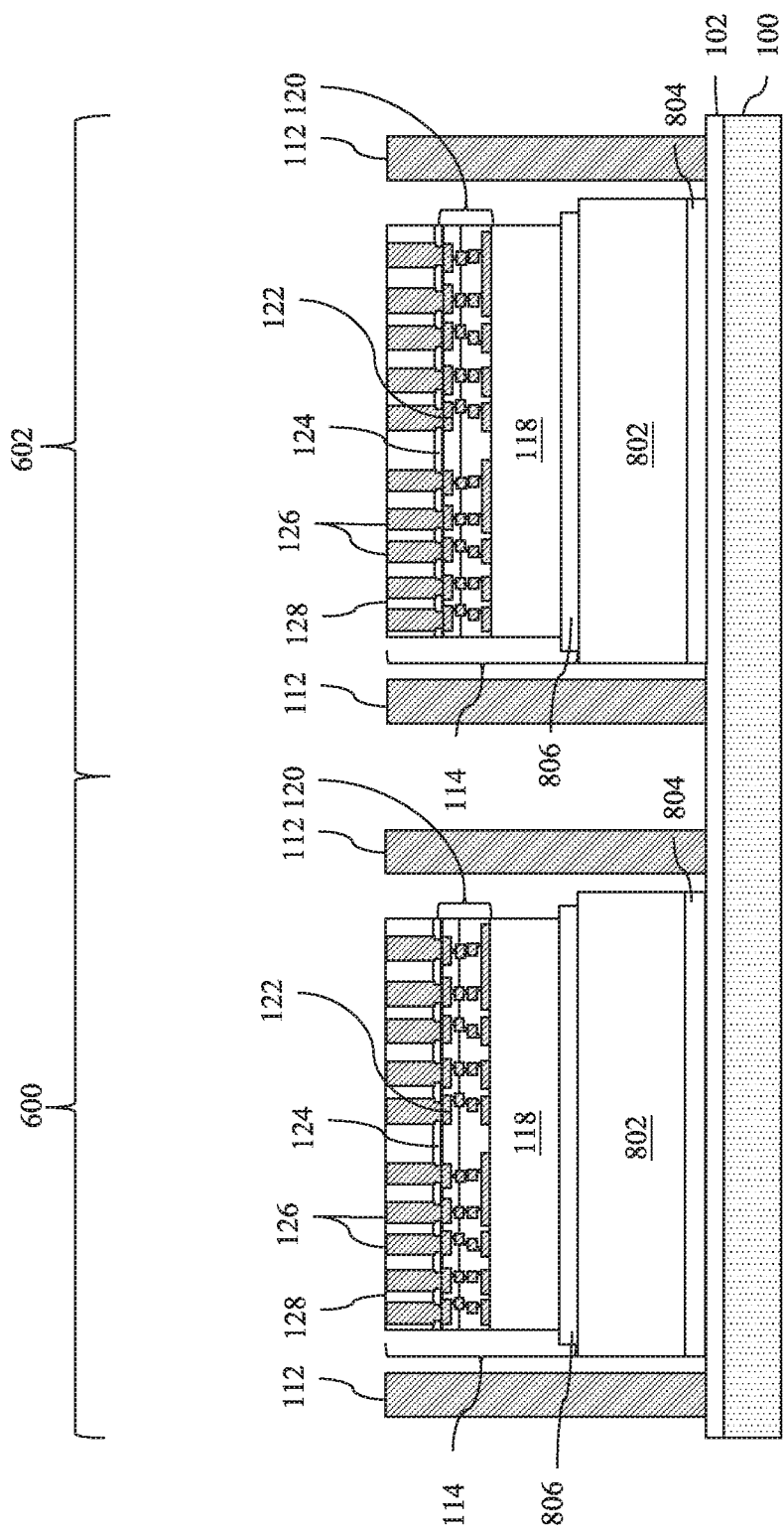
FIGS. 19 through 21 illustrate cross-sectional views of intermediate steps during a process for another package structure in accordance with some embodiments.
Figure 20:
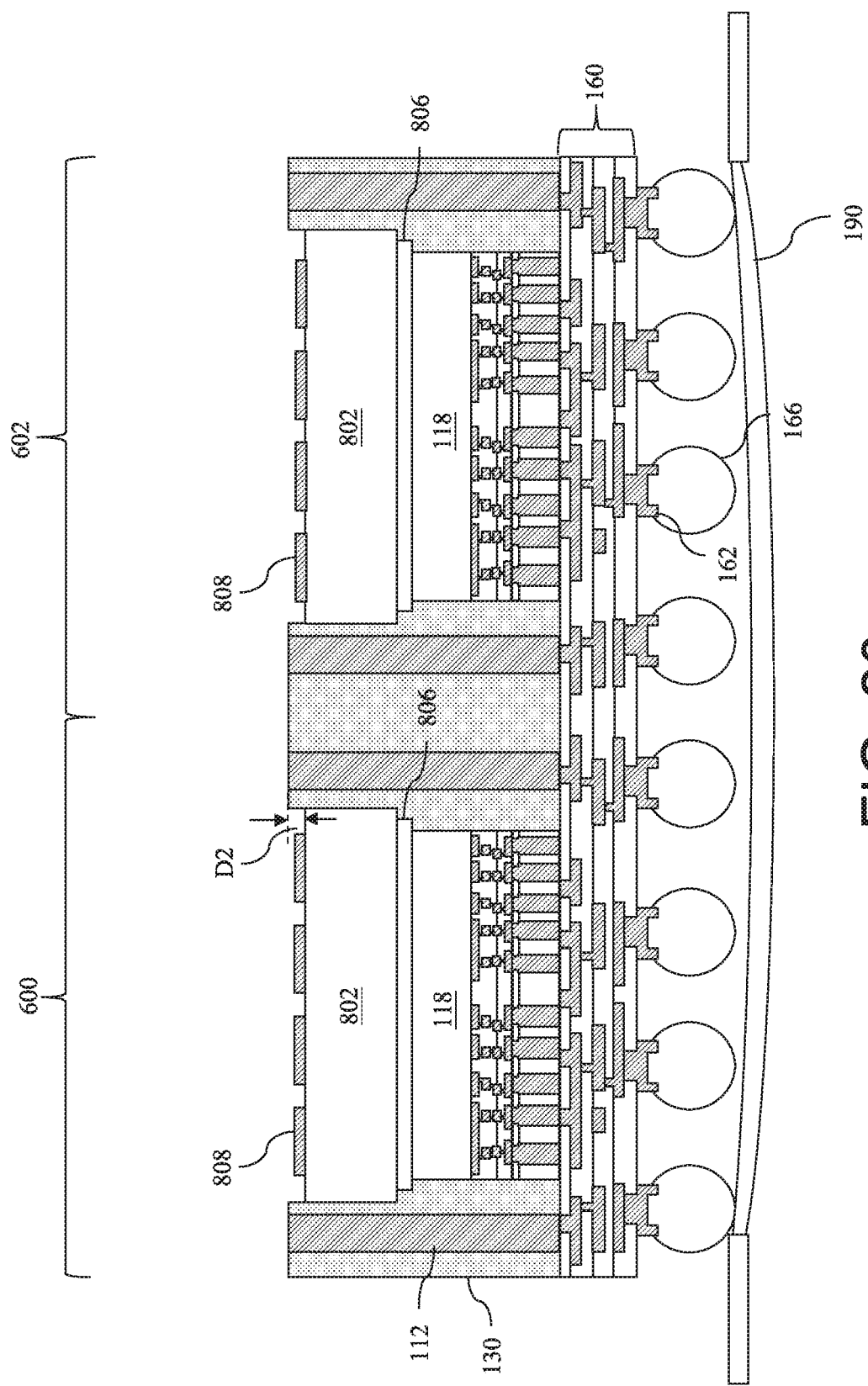
Figure 21:
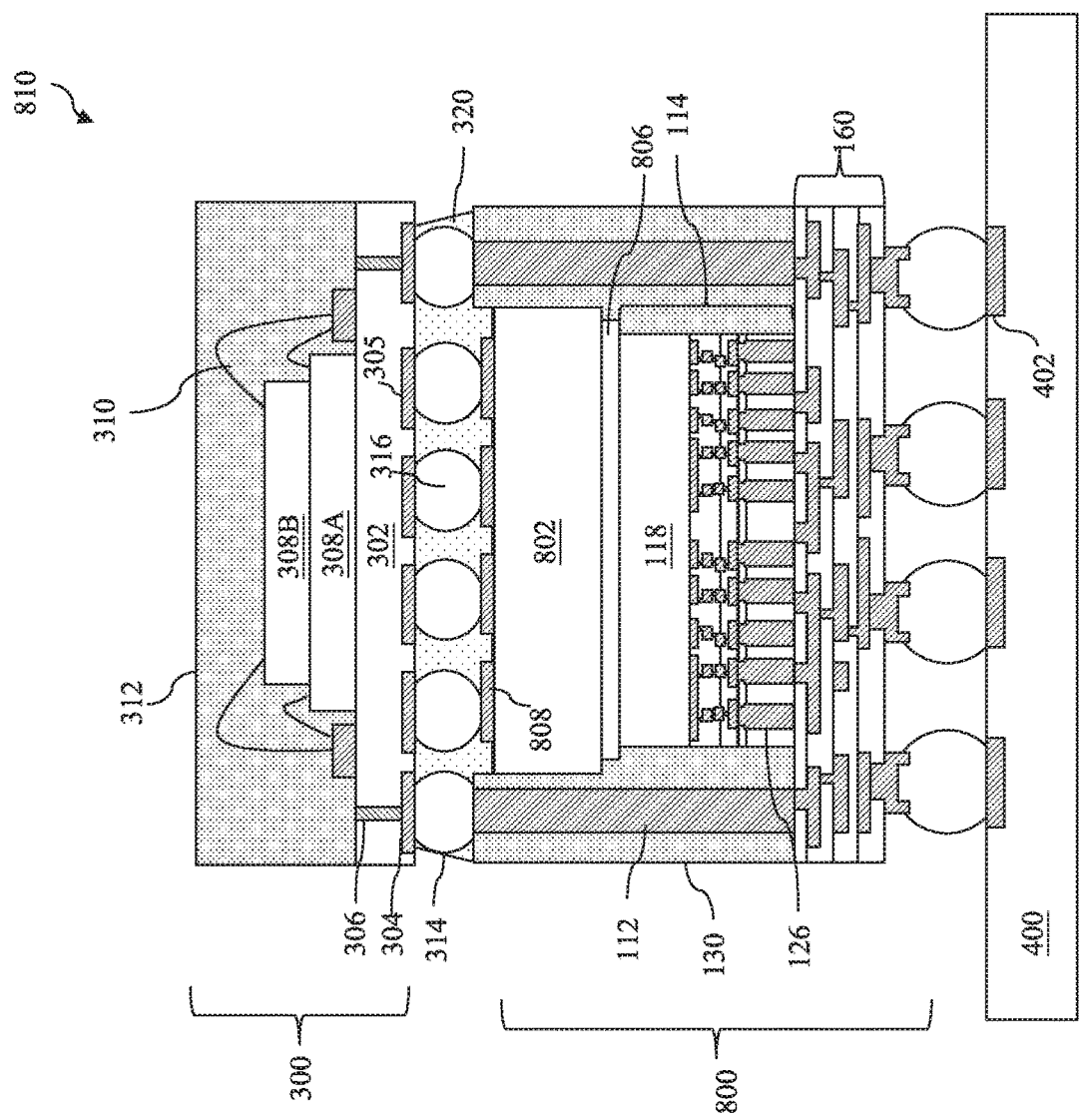

FIGS. 19 through 21 illustrate cross-sectional views of intermediate steps during a process for another package structure in accordance with some embodiments. The embodiment in FIGS. 19 through 21 is similar to the embodiments illustrated in FIGS. 1 through 12 except that in this embodiment, the integrated circuit dies 114 are attached to dummy dies with thermal pads 808 formed on the back-sides of the dummy dies. Details regarding this embodiment that are similar to those for the previously described embodiment will not be repeated herein.

FIG. 19 illustrates an equivalent intermediate stage of processing as FIG. 2 described above and the description is not repeated herein. In FIG. 19, the dummy dies 802 are adhered to the release layer 102 by an adhesive 804, and the integrated circuit dies 114 are adhered to the dummy dies 802 by an adhesive 806. In some embodiments, the dummy dies 802 are formed of a rigid material, which may have a Young's modulus equal to or greater than the Young's modulus of silicon (about 165 GPa to about 179 GPa). Accordingly, the dummy dies 802 may have a Young's modulus equal to or greater than about 165 GPa.

Before being adhered to the release layer 102, the dummy dies 802 may be processed according to applicable manufacturing processes to the dummy dies 802. For example, the dummy dies 802 may be formed by preparing and singulating a dummy wafer. The dummy wafer may be a semiconductor wafer, such as a silicon wafer. In some embodiments, the dummy wafer may be a metal wafer. The dummy wafer may be thinned, for example, in a grinding process. The resulting thickness of the dummy wafer is great enough so that the dummy wafer may provide adequate mechanical support to the overlying structures, which are built in subsequent steps.

The dummy dies 802 may have a good thermal conductivity. The thermal conductivity of the dummy dies 802 may be close to (for example, greater than 90 percent of) the thermal conductivity of the semiconductor substrates (such as silicon substrates) in the overlying integrated circuit dies 114. For example, silicon has a thermal conductivity equal to about 148 W/(m*K), and hence the thermal conductivity of dummy wafer 24 may be greater than about 135 W/(m*K) or higher. With the dummy dies 802 having a high thermal conductivity, the thermal dissipation in the resulting structure is improved.

In accordance with some embodiments of the present disclosure, the dummy dies 802 are formed of a metal or a metal alloy, a semiconductor material, or a dielectric material. For example, when including metal, the dummy dies 802 may be formed of copper, aluminum, nickel, or the like, and hence is a metal film/plate in accordance with some embodiments. When formed of a semiconductor material, the dummy dies 802 may be a singulated silicon wafer, which may be the same type of wafer on which active devices integrated circuit dies 14 are formed. When formed of a dielectric material, the dummy dies 802 may be formed of ceramic. In addition, the material of the dummy dies 802 may be homogenous. For example, the entirety of each of the dummy dies 802 may be formed of the same material, which includes same elements, and the atomic percentages of the elements may be uniform throughout the dummy dies 802. In accordance with some exemplary embodiments, the dummy dies 802 are formed of silicon, with a p-type or an n-type impurity doped in the dummy dies 802. In accordance with alternative embodiments, no p-type impurity and n-type impurity are doped in the dummy dies 802.

In FIG. 19, integrated circuit dies 114 are adhered to the dummy dies 802 by an adhesive 806. In some embodiments, the adhesive 806 is a conductive layer (may be referred to as conductive layer 806 hereinafter) formed in a similar manner to the thermal pads 712 except that the conductive layer 806 can be formed across the entirety of the back-sides of the integrated circuit dies 114.

The conductive layer 806 is not utilized to electrically connect devices or metallization patterns in integrated circuit dies 114 or package structures but is utilized to dissipate heat from the integrated circuit dies 114 and/or package structures. In some embodiments, the conductive layer 806 may be referred to as a thermal layer 806 that are utilized for dissipating heat from the integrated circuit dies 114 to the dummy dies 802. In some embodiments, the conductive layer 806 is not connected to thermal dissipation paths in the integrated circuit dies 114, while in some embodiments, the thermal layer 806 are connected to thermal dissipation paths in the integrated circuit dies 114 with through vias (see, e.g., FIG. 14).

The thermal layer 806 is also used to thermally connect to dummy dies 802. In the illustrated embodiment, the thermal layer 806 is formed on the back-sides of the substrates 118 of the integrated circuit dies 114. As an example to form the thermal layer 806, a seed layer (not shown) is formed over the back-sides of the substrates 118. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A conductive material is formed in on the seed layer. The conductive material may be formed by plating, such as electroplating or electroless plating, or the like. The conductive material may comprise a metal, like copper, titanium, tungsten, aluminum, or the like. The seed layer and conductive material form the thermal layer 806.

FIG. 20 illustrates further processing on the structure of FIG. 19. The processing between these two figures is similar to the processing illustrated and described above in reference to FIGS. 3 through 8 with FIG. 8 being an equivalent intermediate stage as FIG. 20 and the descriptions are not repeated herein.

In FIG. 20, thermal pads 808 are formed on back-sides of the dummy dies 802. The thermal pads 808 have similar materials and methods for forming as the thermal pads 182 of FIG. 8 and the description is not repeated herein.

FIG. 21 illustrates further processing on the structure of FIG. 20. The processing between these two figures is similar to the processing illustrated and described above in reference to FIGS. 8 through 12 with FIG. 12 being an equivalent stage of processing as FIG. 21 and the descriptions are not repeated herein.

The dummy die 802 of this embodiment can be included packages of the other disclosed embodiments of this disclosure.

FIGS. 22 through 25 illustrate cross-sectional views of intermediate steps during a process for another package structure in accordance with some embodiments. The embodiment in FIGS. 22 through 27 is similar to the embodiments illustrated in FIGS. 1 through 12 except that in this embodiment, the integrated circuit dies 114 are have back-side redistribution structures. Details regarding this embodiment that are similar to those for the previously described embodiment will not be repeated herein.

Figure 22:
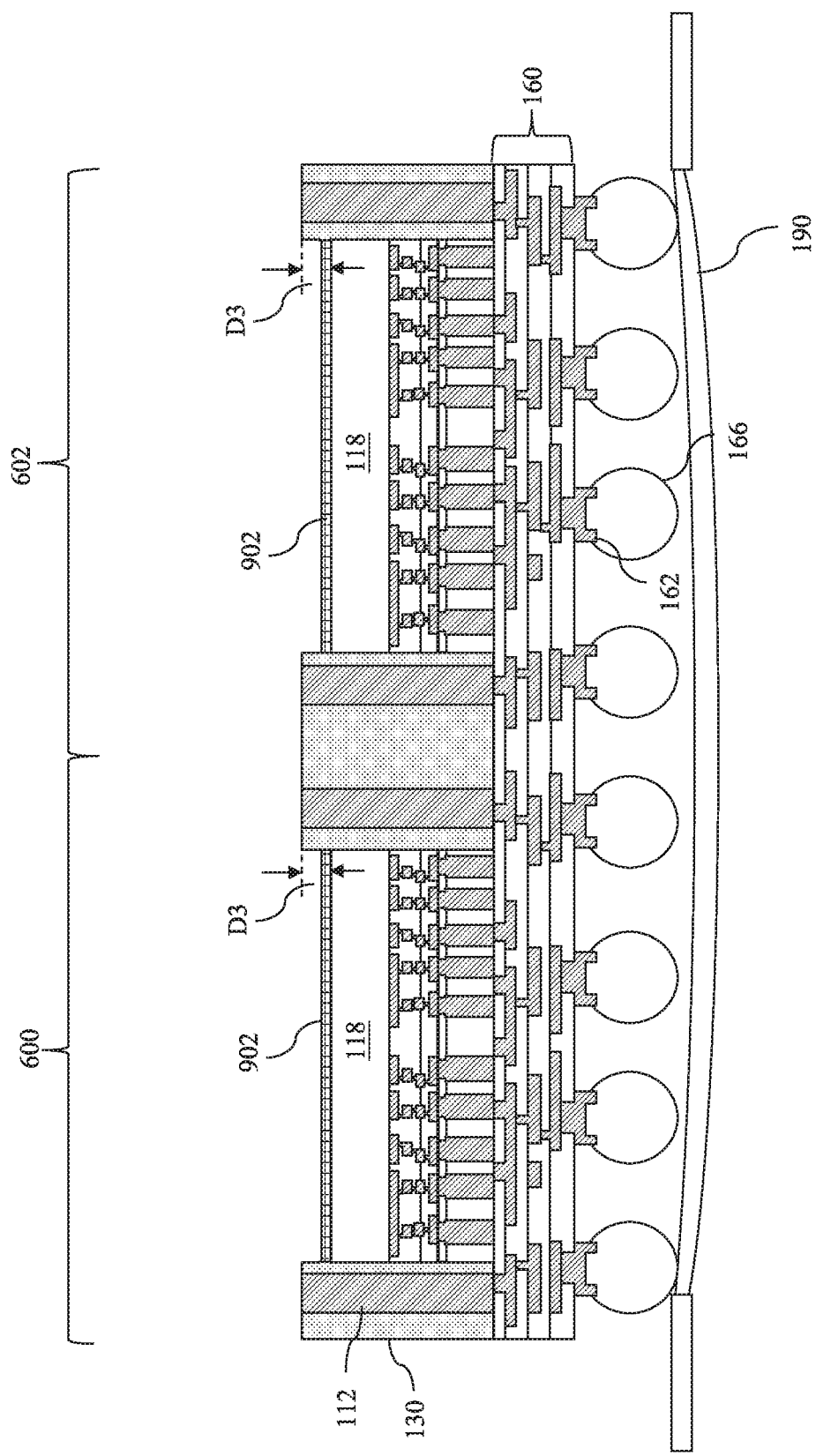
FIGS. 22 through 25 illustrate cross-sectional views of intermediate steps during a process for another package structure in accordance with some embodiments.

FIG. 22 illustrates an equivalent intermediate stage of processing as FIG. 7 described above and the description is not repeated herein. Before forming the seed layer 902, the recesses over the exposed surfaces of the substrates 118 of the integrated circuit dies 114 have a depth D3 as measured from a top surface of the encapsulant 130 to the exposed surface of the substrate 118 of the respective integrated circuit die 114. In some embodiments, the depths D3 of the recesses 714 are in a range from about 5 µm to about 30 µm.

In FIG. 22, a seed layer 902 is formed on the exposed surfaces of the substrates 118 of the integrated circuit dies 114 of the structure of FIG. 7. In some embodiments, the seed layer 902 is a metal layer, which may be a single layer or a composite layer comprising a plurality of sub-layers formed of different materials. In some embodiments, the seed layer 902 comprises a titanium layer and a copper layer over the titanium layer. The seed layer 902 may be formed using, for example, PVD, or the like.

Figure 23:
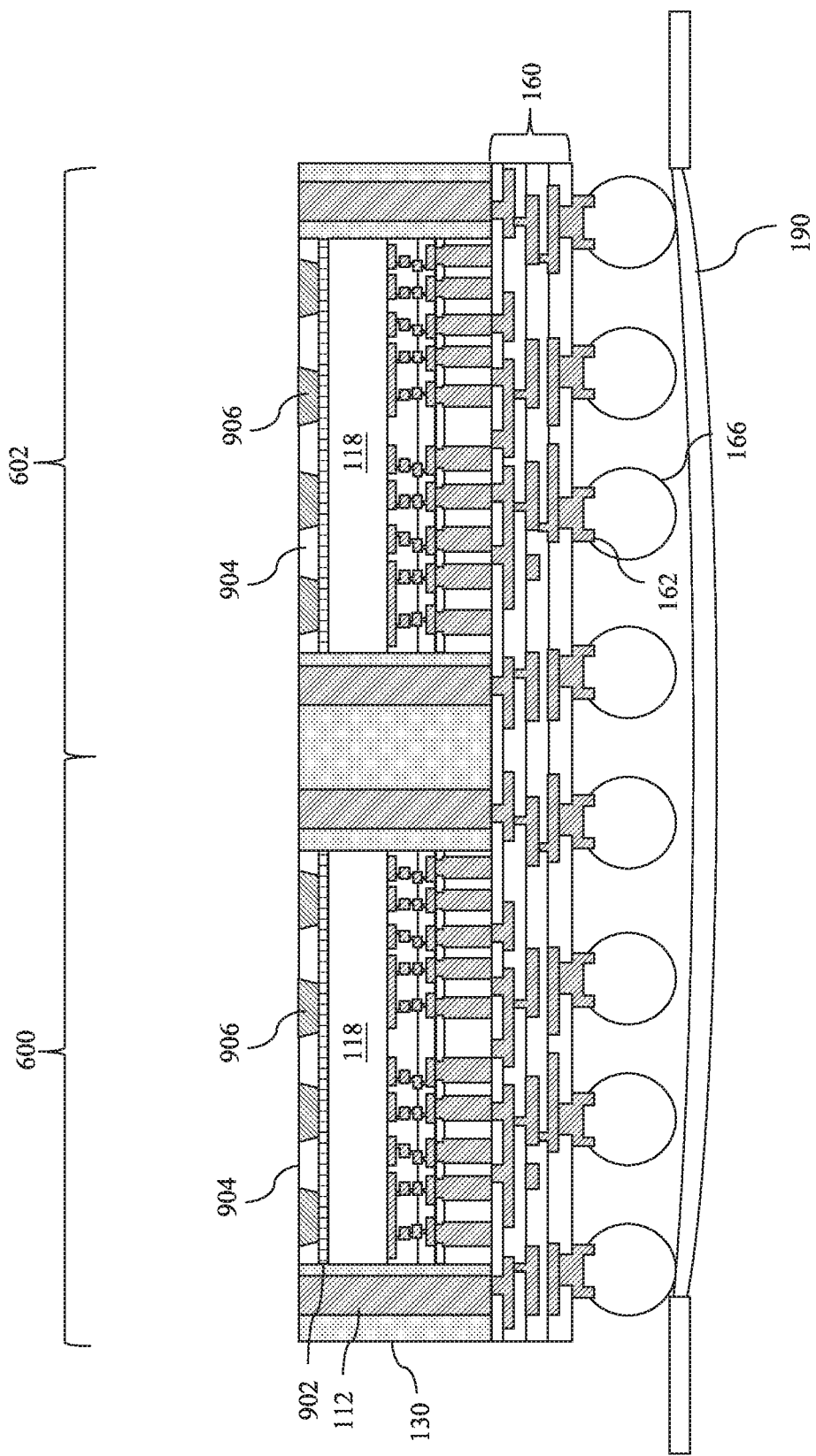
Figure 24:
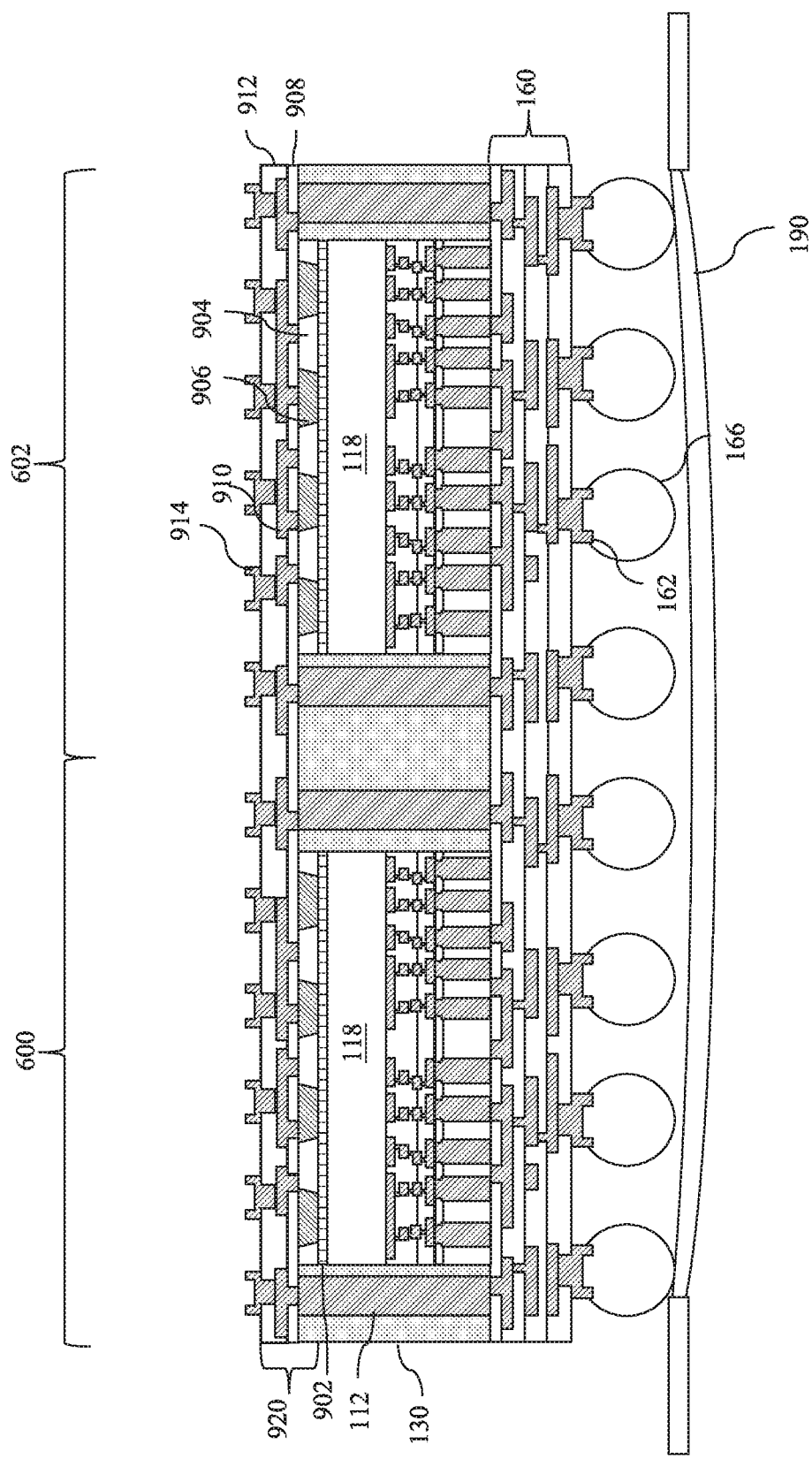

In FIGS. 23 and 24, a back-side redistribution structure 920 is formed. The back-side redistribution structure 920 includes dielectric layers 904, 908, 912 and metallization patterns 906, 910, and 914.

The formation of the back-side redistribution structure 920 may begin by depositing the dielectric layer 904 on the seed layer 902. In some embodiments, the dielectric layer 904 is formed of a polymer, which may be a photo-sensitive material such as PBO, polyimide, BCB, or the like, that may be patterned using a lithography mask. In other embodiments, the dielectric layer 904 is formed of a nitride such as silicon nitride; an oxide such as silicon oxide, PSG, BSG, BPSG; or the like. The dielectric layer 904 may be formed by spin coating, lamination, CVD, the like, or a combination thereof.

Next, the dielectric layer 904 is then patterned. The patterning forms openings to expose portions of the seed layer 902. The patterning may be by an acceptable process, such as by exposing the dielectric layer 904 to light when the dielectric layer 904 is a photo-sensitive material or by etching using, for example, an anisotropic etch. If the dielectric layer 904 is a photo-sensitive material, the dielectric layer 904 can be developed after the exposure.

Next, vias 906 are formed in the dielectric layer 904. As an example to form vias 904, a conductive material is formed in the openings of the dielectric layer 904 and on the exposed portions of the seed layer 902. The conductive material may be formed by plating, such as electroplating or electroless plating, or the like. The conductive material may comprise a metal, like copper, titanium, tungsten, aluminum, or the like. The remaining portions of the seed layer and conductive material form the metallization pattern 138 and vias. The vias are formed in openings through the dielectric layer 132 to, e.g., the through vias 112 and/or the die connectors 126. A planarization process, such as a CMP, may be performed to remove excess conductive from a surface of the dielectric layer 904. The remaining conductive material forms vias 906. After the CMP, surfaces of the vias 906, the dielectric layer 904, the encapsulant 130, and the through vias 112 may be level.

The vias 906 are not utilized to electrically connect devices or metallization patterns in integrated circuit dies 114 or package structures but are utilized to dissipate heat from the integrated circuit dies 114 and/or package structures. In some embodiments, the vias 906 may be referred to as thermal vias 906 that are utilized for dissipating heat from the integrated circuit dies 114. In some embodiments, the thermal vias 906 are not connected to thermal dissipation paths in the integrated circuit dies 114, while in some embodiments, the thermal 906 are connected to thermal dissipation paths in the integrated circuit dies 114 (see, e.g., FIG. 14). The thermal vias 906 are also used to thermally connect to the metallization patterns in the back-side redistribution structure 920 (see FIG. 24). As illustrated, the thermal vias have sidewalls that taper from a top surface of the via 902 to a bottom surface of the via.

In FIG. 24, the dielectric layer 908 is formed on the encapsulant 130, through vias 112, dielectric layer 904, and thermal vias 906. In some embodiments, the dielectric layer 908 is formed of a polymer, which may be a photo-sensitive material such as PBO, polyimide, BCB, or the like, that may be patterned using a lithography mask. In other embodiments, the dielectric layer 908 is formed of a nitride such as silicon nitride; an oxide such as silicon oxide, PSG, BSG, BPSG; or the like. The dielectric layer 908 may be formed by spin coating, lamination, CVD, the like, or a combination thereof.

Next, the dielectric layer 908 is then patterned. The patterning forms openings to expose portions of the through vias 112 and the thermal vias 906. The patterning may be by an acceptable process, such as by exposing the dielectric layer 908 to light when the dielectric layer 908 is a photo-sensitive material or by etching using, for example, an anisotropic etch. If the dielectric layer 908 is a photo-sensitive material, the dielectric layer 908 can be developed after the exposure.

Next, metallization pattern 910 with vias is formed on the dielectric layer 908. As an example to form metallization pattern 910, a seed layer (not shown) is formed over the dielectric layer 908 and in openings through the dielectric layer 908. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 910. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 910 and vias. The vias are formed in openings through the dielectric layer 908 to, e.g., the through vias 112 and/or the thermal vias 906.

After the formation of the metallization pattern and vias 910, the dielectric layer 912 is deposited on the metallization pattern 910 and the dielectric layer 908. In some embodiments, the dielectric layer 912 is formed of a polymer, which may be a photo-sensitive material such as PBO, polyimide, BCB, or the like, that may be patterned using a lithography mask. In other embodiments, the dielectric layer 912 is formed of a nitride such as silicon nitride; an oxide such as silicon oxide, PSG, BSG, BPSG; or the like. The dielectric layer 912 may be formed by spin coating, lamination, CVD, the like, or a combination thereof.

Next, the dielectric layer 912 is then patterned. The patterning forms openings to expose portions of the metallization pattern 910. The patterning may be by an acceptable process, such as by exposing the dielectric layer 912 to light when the dielectric layer is a photo-sensitive material or by etching using, for example, an anisotropic etch. If the dielectric layer 912 is a photo-sensitive material, the dielectric layer 912 can be developed after the exposure.

The back-side redistribution structure 920 is shown as an example. More or fewer dielectric layers and metallization patterns may be formed in the back-side redistribution structure 920. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Next, pads 914 are formed on an exterior side of the front-side redistribution structure 160. The pads 914 are used to couple to conductive connectors 316 and 314 (see FIG. 25) and may be referred to as under bump metallurgies (UBMs) 914. In the illustrated embodiment, the pads 914 are formed through openings through the dielectric layer 912 to the metallization pattern 910. As an example to form the pads 914, a seed layer (not shown) is formed over the dielectric layer 912. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 914. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 914. In the embodiment, where the pads 914 are formed differently, more photo resist and patterning steps may be utilized.

The back-side redistribution structure 920 and pads 914 electrically couple the through vias 112 and the package 900 to the subsequently bonded package 300 by way of the conductive connectors 314.

Figure 25:
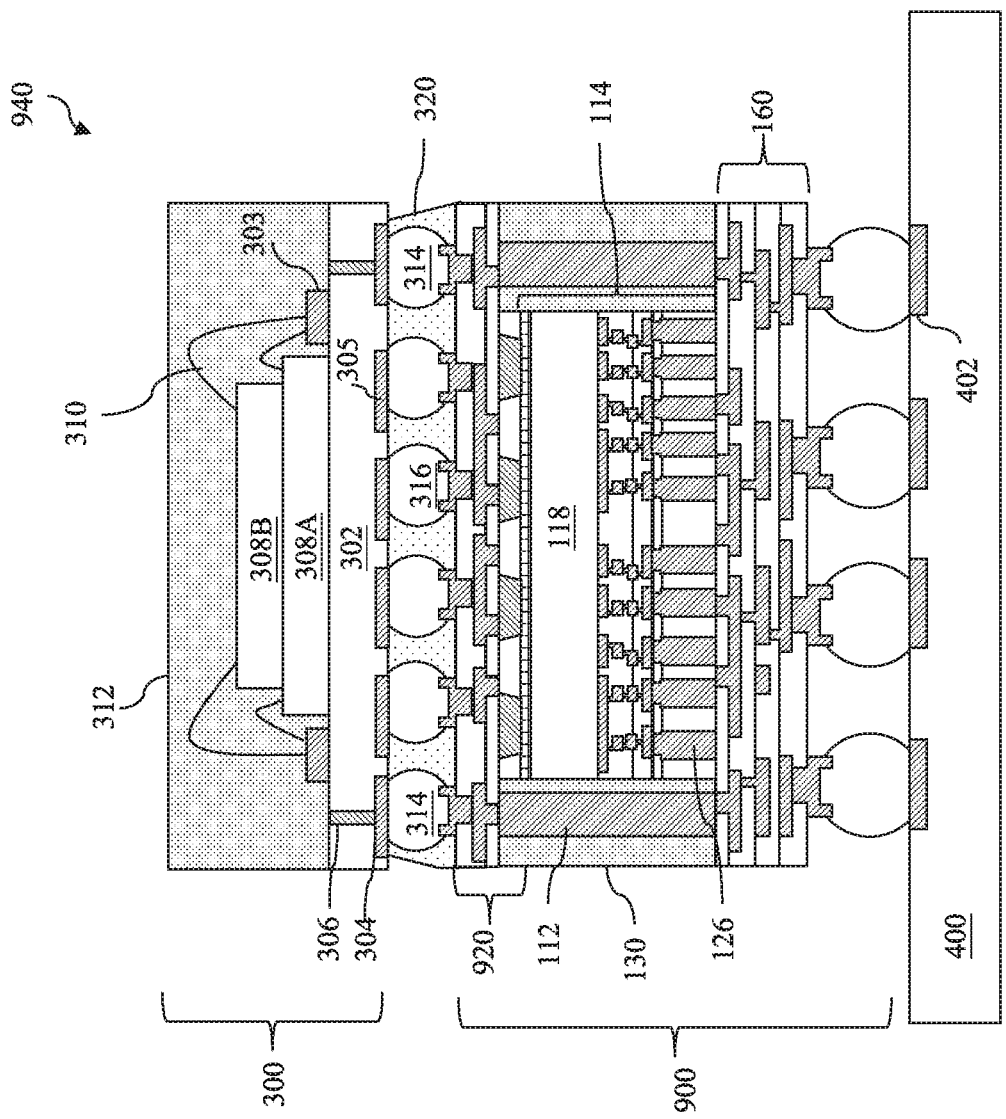

FIG. 25 illustrates further processing on the structure of FIG. 24. The processing between these two figures is similar to the processing illustrated and described above in reference to FIGS. 8 through 12 with FIG. 12 being an equivalent stage of processing as FIG. 25 and the descriptions are not repeated herein.

The back-side redistribution structure 920 and thermal vias 906 of this embodiment can be included packages of the other disclosed embodiments of this disclosure.

FIGS. 26 through 29 illustrate cross-sectional views of intermediate steps during a process for another package structure in accordance with some embodiments. The embodiment in FIGS. 26 through 29 is similar to the embodiments illustrated in FIGS. 22 through 25 except that in this embodiment, a planarization process is performed to remove the recess before the vias 906 are formed. Details regarding this embodiment that are similar to those for the previously described embodiment will not be repeated herein.

Figure 26:
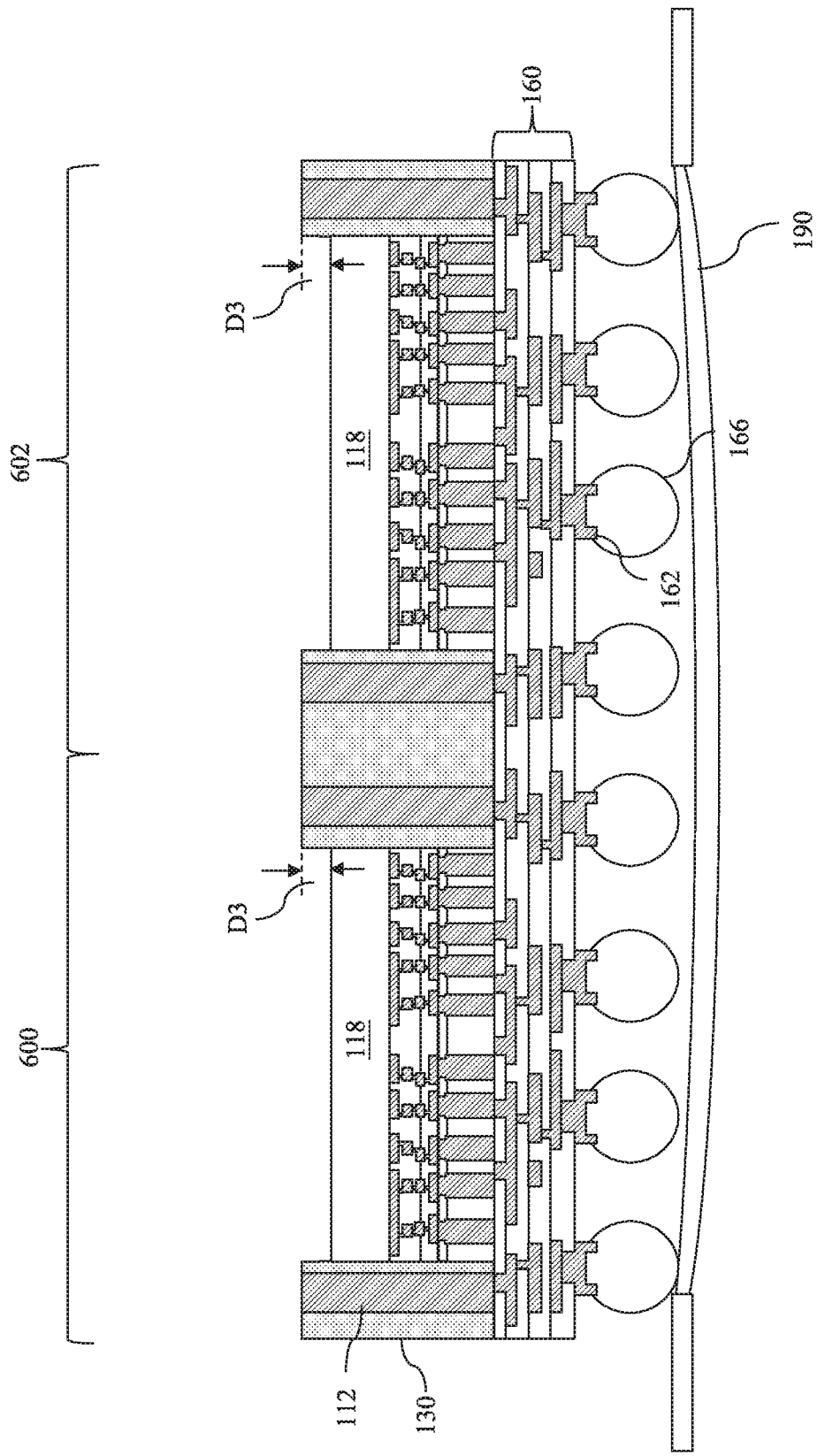
FIGS. 26 through 29 illustrate cross-sectional views of intermediate steps during a process for another package structure in accordance with some embodiments.

FIG. 26 illustrates an equivalent intermediate stage of processing as FIG. 7 and the description is not repeated herein. In this embodiment, the recesses over the exposed surfaces of the substrates 118 of the integrated circuit dies 114 have a depth D3 as measured from a top surface of the encapsulant 130 to the exposed surface of the substrate 118 of the respective integrated circuit die 114. In some embodiments, the depths D3 of the recesses 714 are in a range from about 5 μm to about 30 μm.

Figure 27:
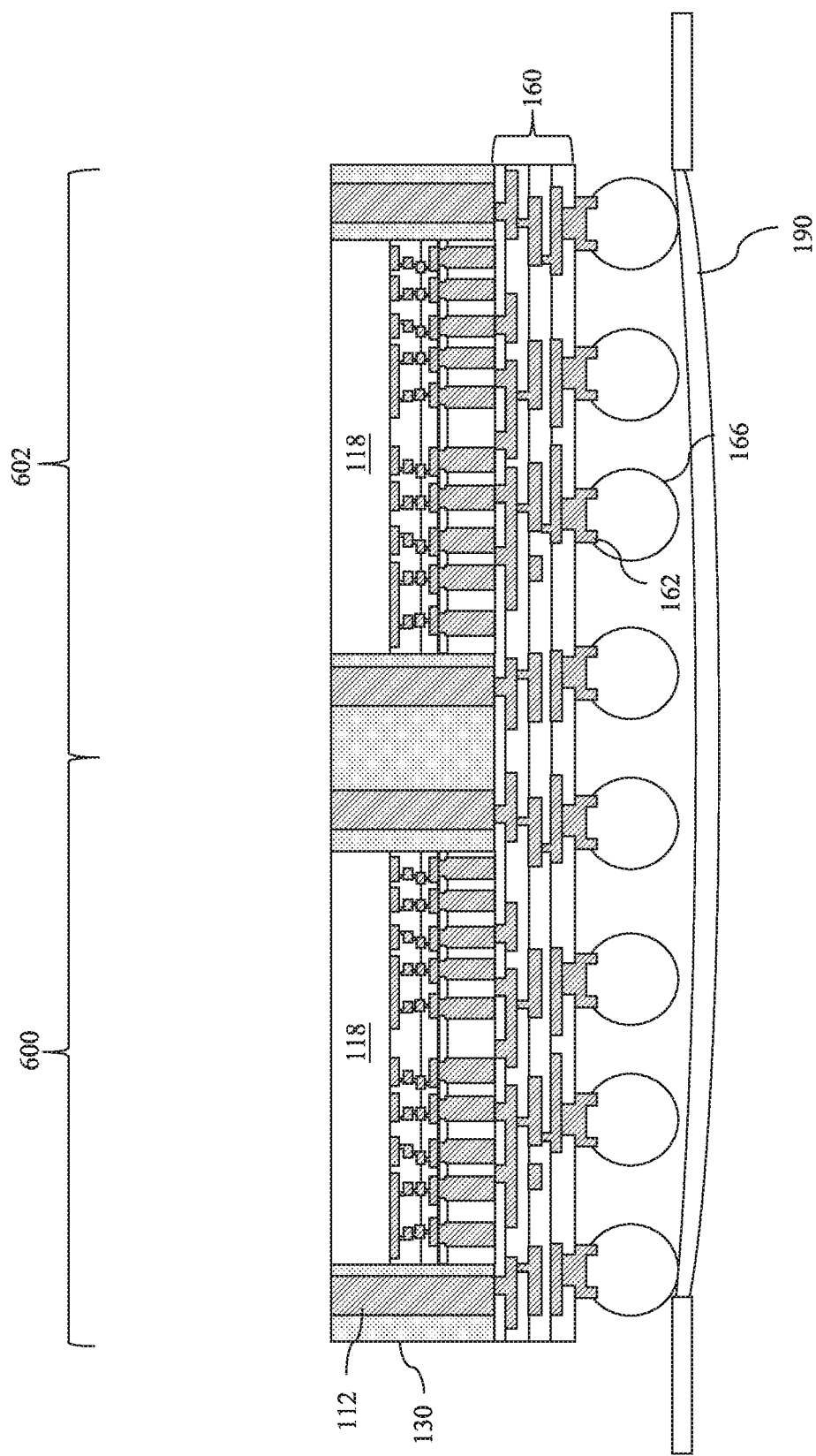

In FIG. 27, a planarization process, such as a CMP, may be performed to level surfaces of the substrates 118 of the integrated circuit dies 114, the encapsulant 130, and the through vias 112. Said another way, the planarization process removes the recesses.

Figure 28:
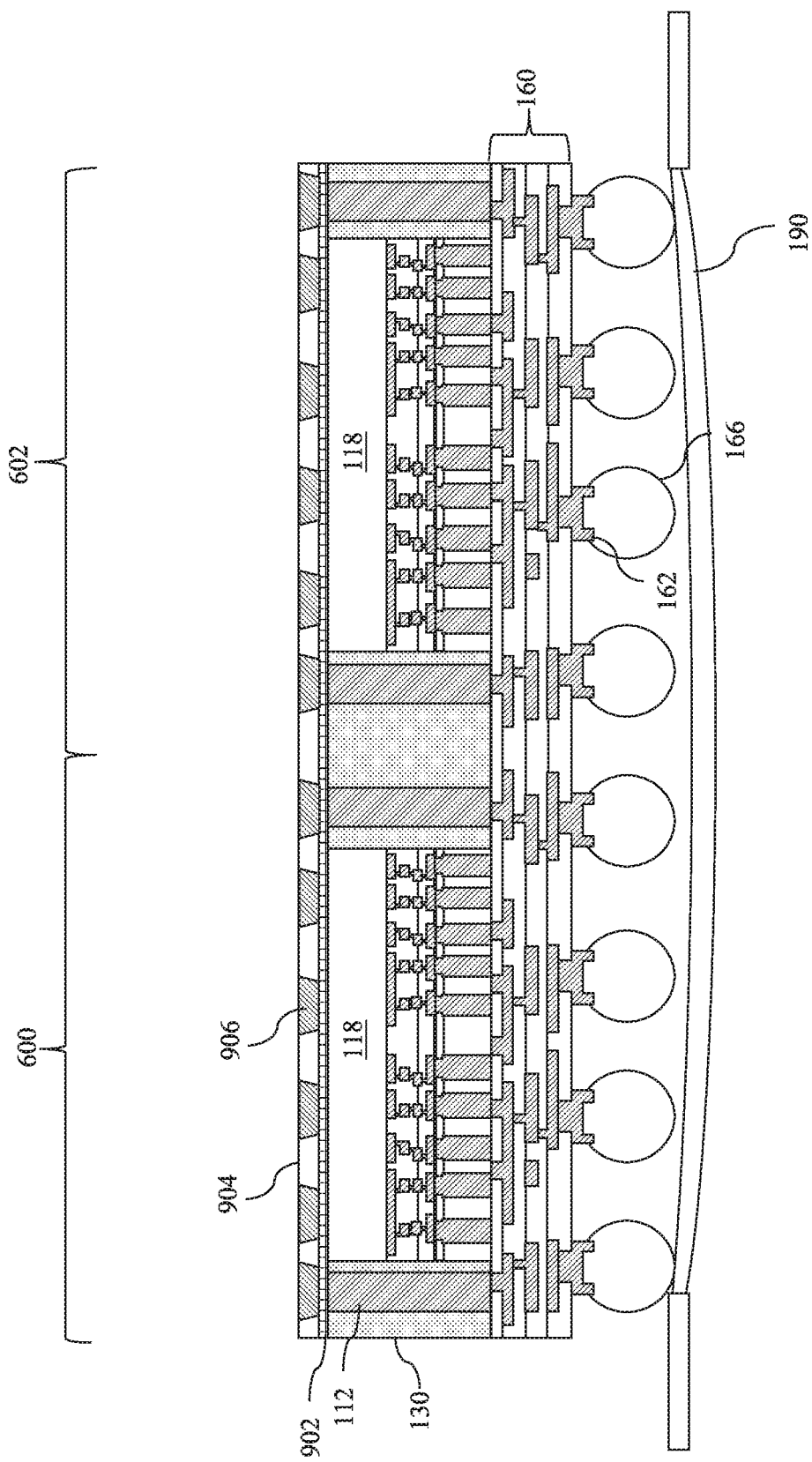

In FIG. 28, the seed layer 902, the dielectric layer 904, and the vias 906 are formed over the planarized surfaces of the substrates 118 of the integrated circuit dies 114, the encapsulant 130, and the through vias 112. The materials and formation of these structures were described in the previous embodiments and the descriptions are not repeated herein. In this embodiment, some of the vias 906 are electrically and physically connected to the through vias 112 to electrically couple the through vias 112 to the subsequently bonded package 300. While some of the vias 906 are utilized as thermal vias (e.g., the vias 906 directly overlying the substrates 118 of the integrated circuit dies 114.

Figure 29:
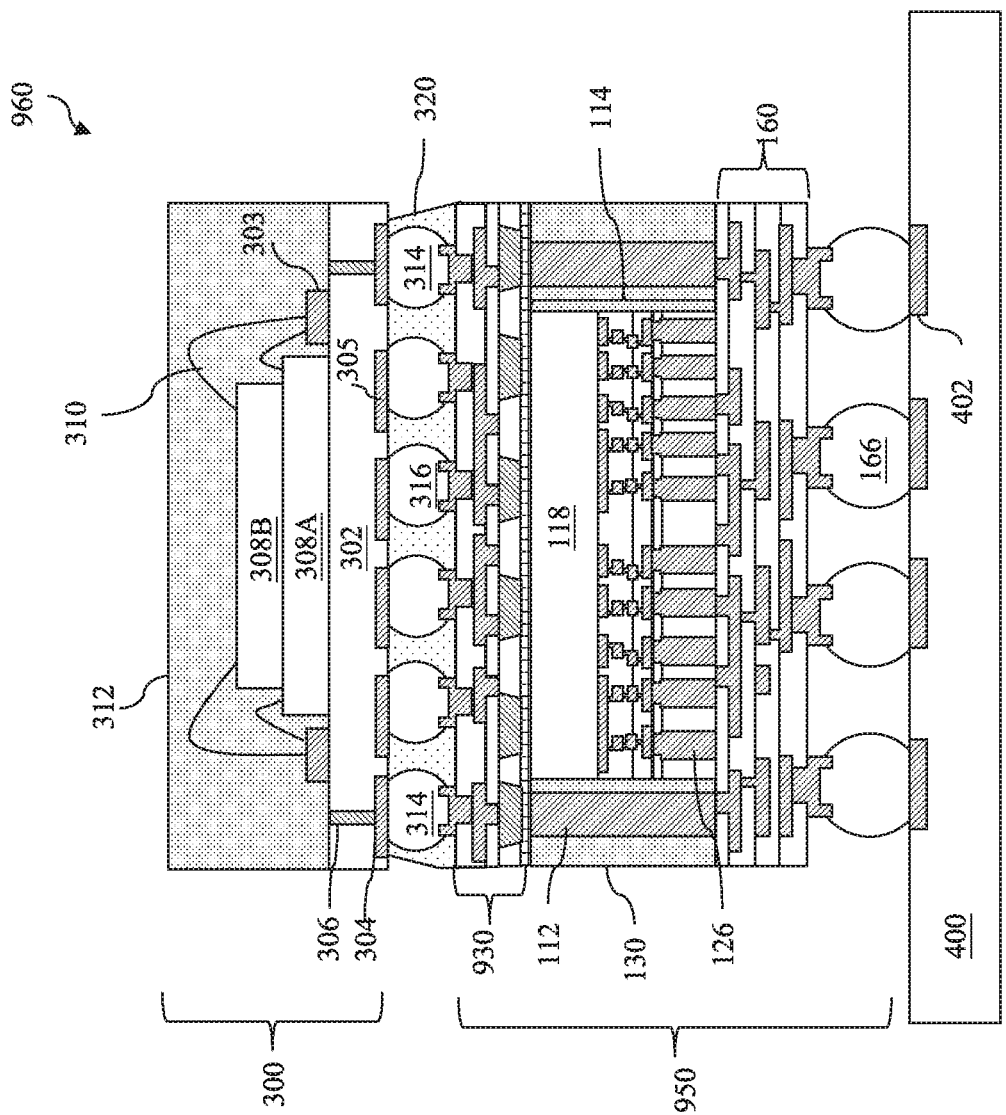

FIG. 29 illustrates further processing on the structure of FIG. 28. The processing between these two figures is similar to the processing illustrated and described above in reference to FIGS. 23 through 25 with FIG. 25 being an equivalent stage of processing as FIG. 29 and the descriptions are not repeated herein. In FIG. 29, a back-side redistribution structure 930, similar to the back-side redistribution 920 of the previous embodiment, is illustrated and the description is not repeated herein.

The back-side redistribution structure 930 and thermal vias 906 of this embodiment can be included packages of the other disclosed embodiments of this disclosure.

FIGS. 30 through 35 illustrate cross-sectional views of intermediate steps during a process for another package structure in accordance with some embodiments. The embodiment in FIGS. 30 through 35 is similar to the embodiments illustrated in FIGS. 1 through 12 except that in this embodiment, a back-side redistribution structure is formed over the carrier before the integrated circuit dies 114 are attached to the carrier. Details regarding this embodiment that are similar to those for the previously described embodiment will not be repeated herein.

Figure 30:
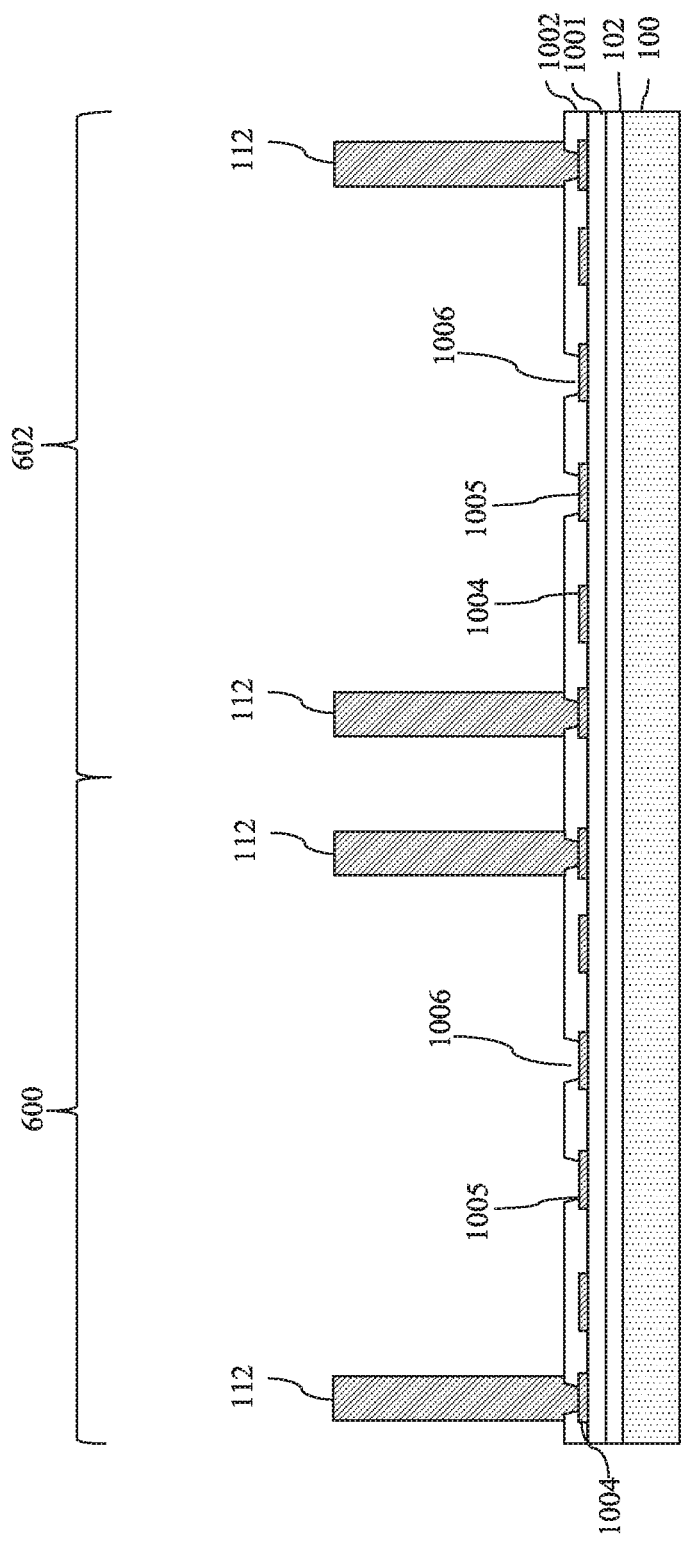
FIGS. 30 through 35 illustrate cross-sectional views of intermediate steps during a process for another package structure in accordance with some embodiments.

FIG. 30 illustrates a carrier substrate 100 and release layer 102 over the carrier substrate as described above in FIG. 1 and the description is not repeated herein. In FIG. 30, a dielectric layer 1001, metallization patterns 1004 and 1005, a dielectric layer 1002, and through vias 112 are further formed over the release layer 102.

The dielectric layer 1001 is formed on the release layer 102. The bottom surface of the dielectric layer 1001 may be in contact with the top surface of the release layer 102. In some embodiments, the dielectric layer 1001 is formed of a polymer, such PBO, polyimide, BCB, or the like. In other embodiments, the dielectric layer 1001 is formed of a nitride such as silicon nitride; an oxide such as silicon oxide, PSG, BSG, BPSG, or the like; or the like. The dielectric layer 1001 may be formed by any acceptable deposition process, such as spin coating, CVD, laminating, the like, or a combination thereof.

The metallization patterns 1004 and 1005 are formed on the dielectric layer 1001. As an example to form metallization patterns 1004 and 1005, a seed layer (not shown) is formed over the dielectric layer 1001. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization patterns 1004 and 1005. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization patterns 1004 and 1005.

The dielectric layer 1002 is formed on the metallization patterns 1004 and 1005 and the dielectric layer 1001. In some embodiments, the dielectric layer 1002 is formed of a polymer, which may be a photo-sensitive material such as PBO, polyimide, BCB, or the like, that may be patterned using a lithography mask. In other embodiments, the dielectric layer 1002 is formed of a nitride such as silicon nitride; an oxide such as silicon oxide, PSG, BSG, BPSG; or the like. The dielectric layer 1002 may be formed by spin coating, lamination, CVD, the like, or a combination thereof.

The dielectric layers 1001 and 1002 and the metallization patterns 1004 and 1005 may be referred to as a back-side redistribution structure. As illustrated, the back-side redistribution structure includes the two dielectric layers 1001 and 1002 and one metallization pattern 1004. In other embodiments, the back-side redistribution structure can include any number of dielectric layers, metallization patterns, and vias. One or more additional metallization pattern and dielectric layer may be formed in the back-side redistribution structure by repeating the processes for forming a metallization patterns 1004 and dielectric layer 1002. Vias may be formed during the formation of a metallization pattern by forming the seed layer and conductive material of the metallization pattern in the opening of the underlying dielectric layer. The vias may therefore interconnect and electrically couple the various metallization patterns.

The dielectric layer 1002 is patterned to form openings 1006 to expose portions of the metallization patterns 1004 and 1005. The patterning may be by an acceptable process, such as by exposing the dielectric layer 1002 to light when the dielectric layer is a photo-sensitive material or by etching using, for example, an anisotropic etch. As illustrated in FIG. 30, the dielectric layer 1002 is patterned to expose some of the metallization patterns 1004 and 1005 but not all of the metallization patterns 1004 and 1005. For example, the openings 1006 expose some of the metallizations patterns 1005 that will underlie the subsequently attached integrated circuit dies 114 and will also expose other metallization patterns 1004 that the through vias 112 will be formed upon, while other metallization patterns 1004 remain covered by the dielectric layer 1002.

Further in FIG. 30, through vias 112 are formed. As an example to form the through vias 112, a seed layer is formed over the back-side redistribution structure, e.g., the dielectric layer 1002 and the exposed portions of the metallization patterns 1004. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 112.

Figure 31:
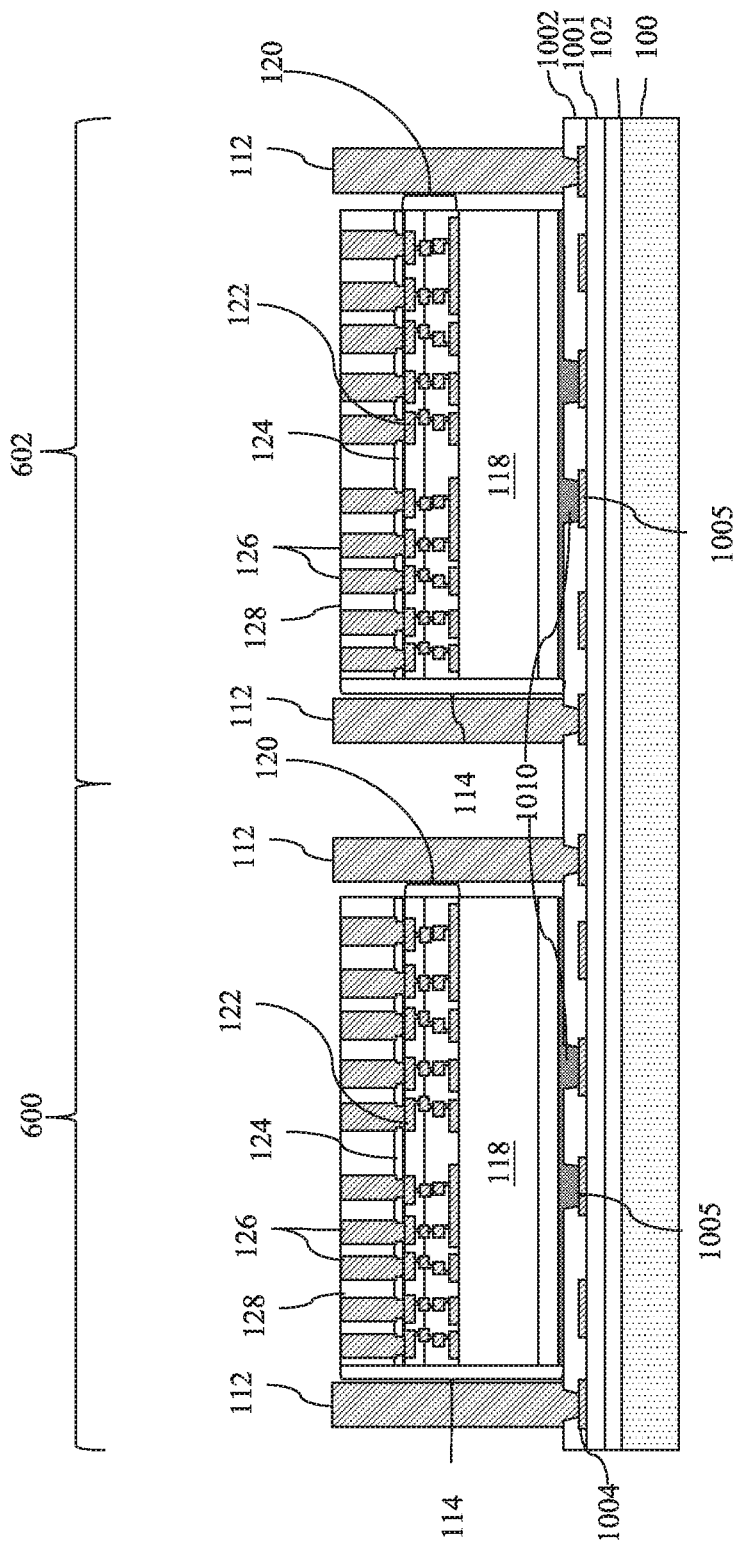

In FIG. 31, integrated circuit dies 114 are adhered to the back-side redistribution structure by a layer 1010. The integrated circuit dies 114 were previously described and the description is not repeated herein. As illustrated in FIG. 31, one integrated circuit die 114 is adhered in each of the first package region 600 and the second package region 602, and in other embodiments, more integrated circuit dies 114 may be adhered in each region. For example, in an embodiment, two integrated circuit dies 114 or four integrated circuit dies 114 may be adhered in each region.

The layer 1010 is on back-sides of the integrated circuit dies 114 and adheres the integrated circuit dies 114 to the back-side redistribution structure. The layer 1010 may be a high-k DAF, a conductive paste, such as a silver paste, or the like. As illustrated in FIG. 31, the layer 1010 extends down in some of the openings 1006 underlying the integrated circuit dies 114 to contact the exposed metallization patterns 1005 of those openings 1006. The layer 1010 may be applied to a back-side of the integrated circuit dies 114, such as to a back-side of the respective semiconductor wafer or may be applied over the surface of the carrier substrate 100. The integrated circuit dies 114 may be singulated, such as by sawing or dicing, and adhered to back-side redistribution structure by the layer 1010 using, for example, a pick-and-place tool.

The layer 1010 (e.g. high-k DAF or conductive paste) is not utilized to electrically connect devices or metallization patterns in integrated circuit dies 114 or package structures but is utilized to dissipate heat from the integrated circuit dies 114 and/or package structures. In some embodiments, the layer 1010 may be referred to as thermal paste 1010 that is utilized for dissipating heat from the integrated circuit dies 114. In some embodiments, the thermal paste 1010 is not connected to thermal dissipation paths in the integrated circuit dies 114, while in some embodiments, the thermal paste 1010 is connected to thermal dissipation paths in the integrated circuit dies 114 (see, e.g., FIG. 14). The thermal paste 1010 is used to thermally connect the integrated circuit dies 114 to the metallization patterns 1005 in the back-side redistribution structure which are then thermally connected to the connectors 316 (see, e.g., FIG. 35). Hence, the metallization patterns 1005 may be referred to as thermal patterns 1005 hereinafter.

Figure 32:
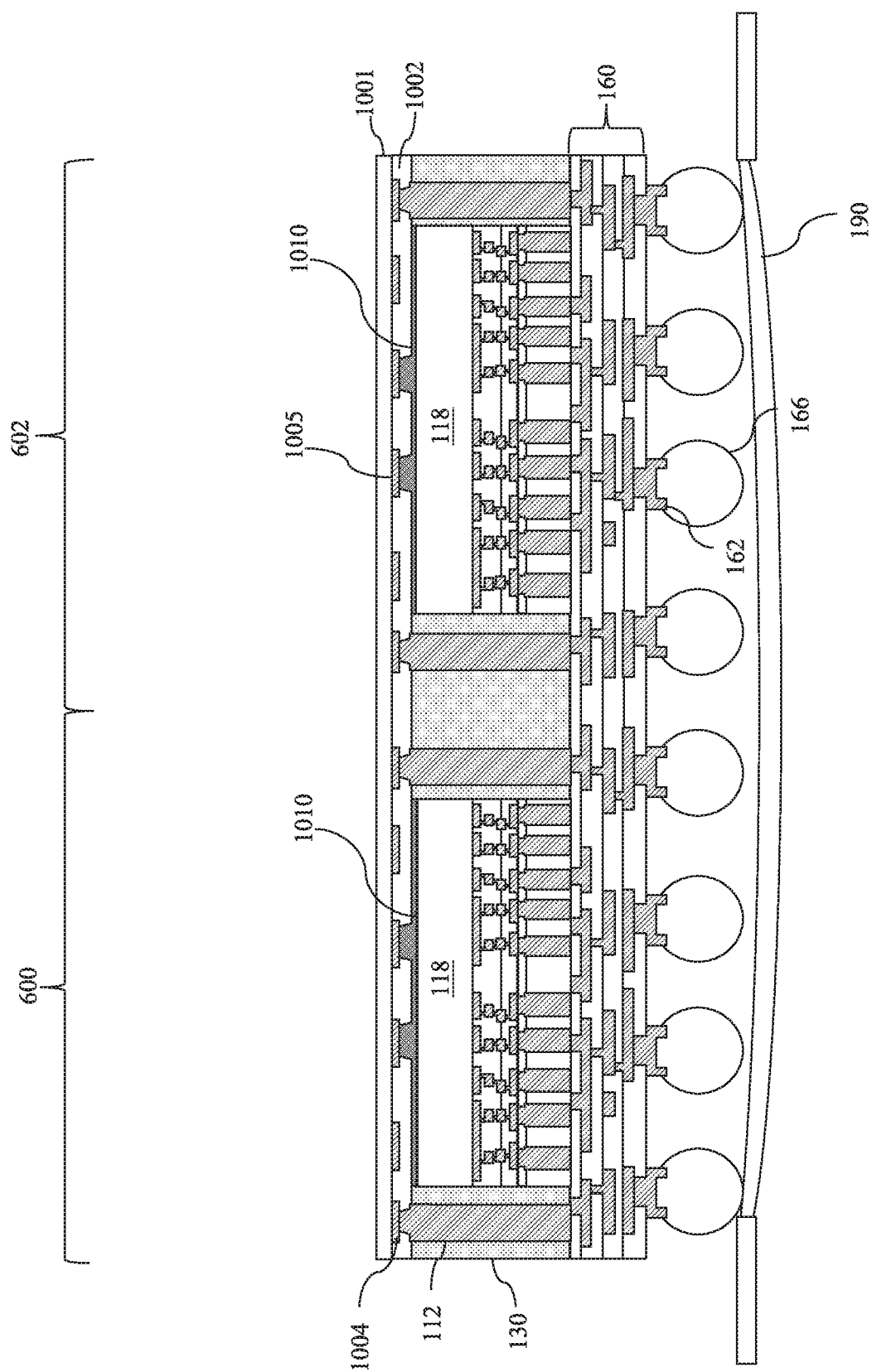

FIG. 32 illustrates further processing on the structure of FIG. 31. The processing between these two figures is similar to the processing illustrated and described above in reference to FIGS. 3 through 6 with FIG. 6 being a similar stage of processing as FIG. 32 and the descriptions are not repeated herein. In FIG. 32, the carrier substrate 100 and release layer 102 are removed and it is placed on the tape 190. After the release layer 102 is removed, the back-side dielectric layer 1001 of the back-side redistribution structure is exposed.

Figure 33:
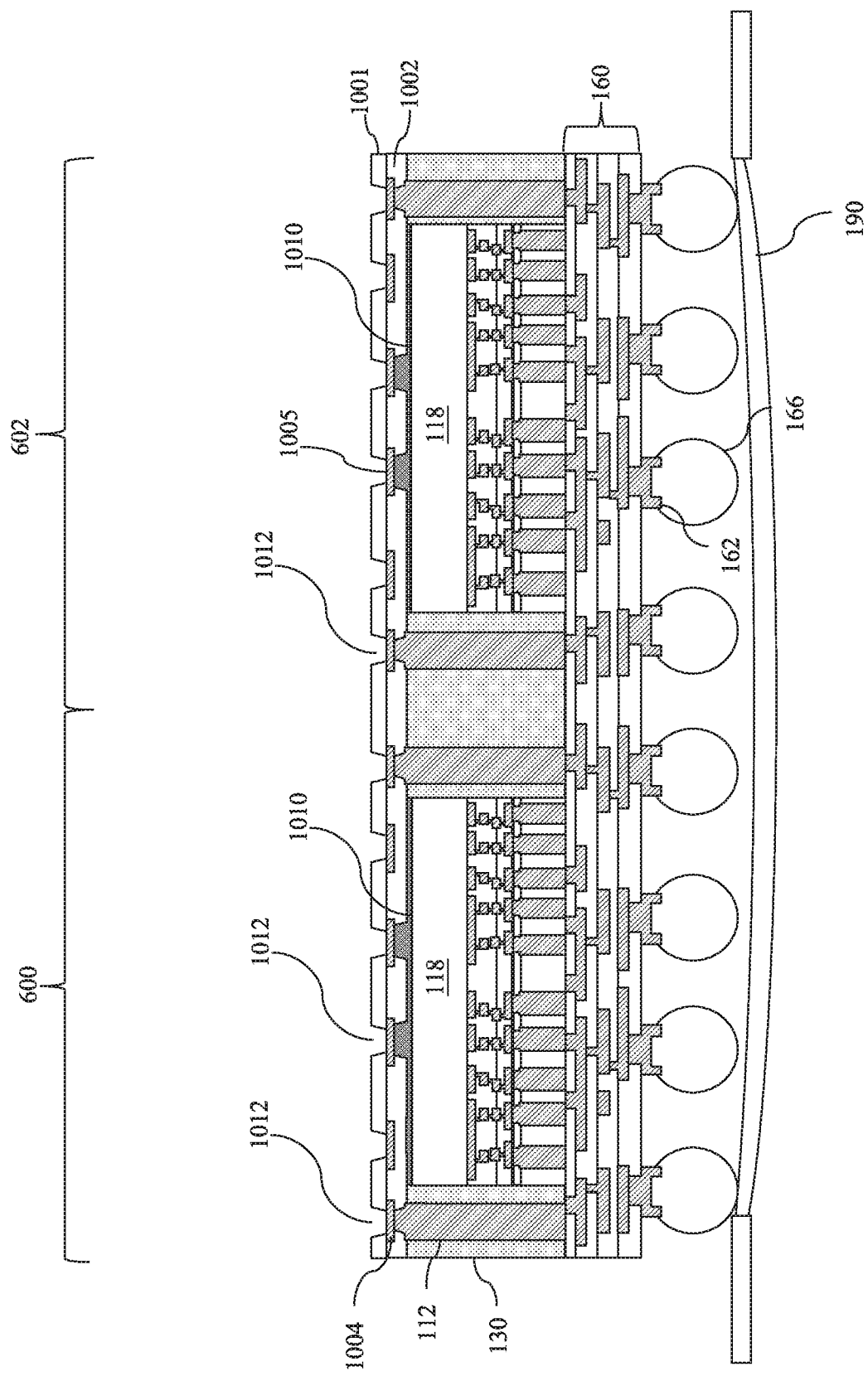

In FIG. 33, a set of openings 1012 are formed in the dielectric layer 1001 to expose portions of the metallization patterns 1004 and thermal patterns 1005. The openings 1012 may be formed a laser drill process, an etch process, the like, or a combination thereof. The openings 1012 exposes the metallization patterns 1004 coupled to the through vias 112 and the thermal patterns 1005 coupled to the thermal paste 1010.

Figure 34:
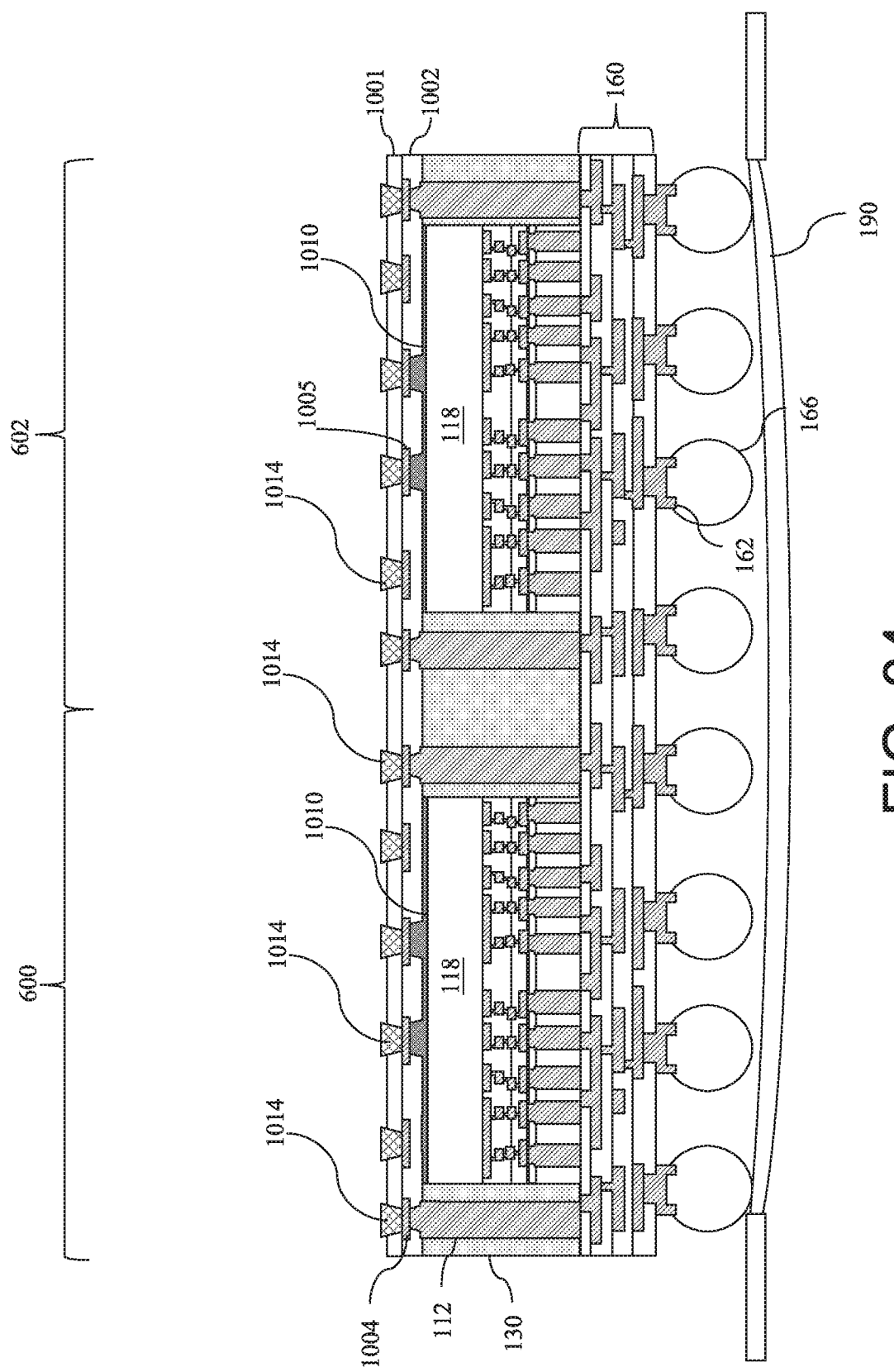

In FIG. 34, a solder-containing layer 1014, which may be a solder layer (sometimes known as a pre-solder layer), a solder paste, or the like, is formed on each of the exposed metallization patterns 1004 and thermal patterns 1005 in the openings 1012. In some embodiments, the solder-containing layer 1014 may completely fill or overfill the openings 1012, while, in other embodiments, the solder-containing layer 1014 may only partially fill the openings 1012. After the solder-containing layer 1014 is deposited, a reflow process may be performed before bonding the conductive connectors 314 and 316 to the solder-containing layer 1014 and package structure 1050 (see, e.g., FIG. 35). In some embodiments, the solder-containing layer 1014 can be omitted.

Figure 35:
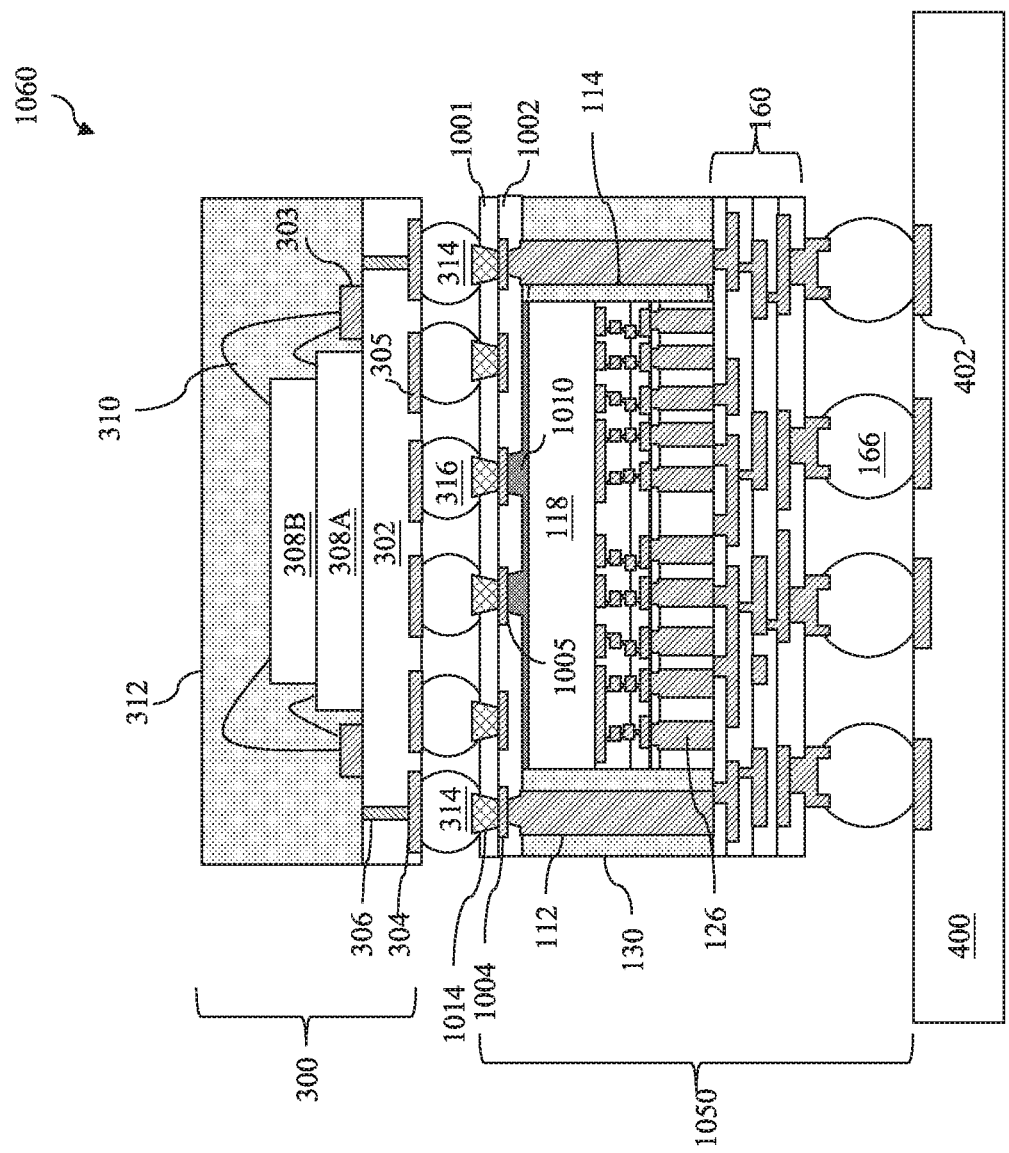

FIG. 35 illustrates further processing on the structure of FIG. 34. The processing between these two figures is similar to the processing illustrated and described above in reference to FIGS. 9 through 12 with FIG. 12 being a similar stage of processing as FIG. 35 and the descriptions are not repeated herein.

After the reflow process to bond the conductive connectors 314 and 316 to the solder-containing layer 1014 and the package structure 1050, the solder-containing layer 1014 the connectors 314 and 316 may intermix and not be distinctly visible as separate structures as shown in FIG. 35.

The conductive connectors 314 are utilized to electrically connect the package structure 1050 to the package structure 300. Similar to the thermal paste 1010, the conductive connectors 316 are not utilized to electrically connect devices or metallization patterns in integrated circuit dies 114 or package structures but are utilized to dissipate heat from the integrated circuit dies 114 and/or package structures. Hence, the conductive connectors 316 may be referred to as thermal connectors 316. By utilizing the thermal paste 1010, the thermal patterns 1005, and the thermal connectors 316, the thermal resistance (° C./Watt) of the package structure can be improved by up to about 8% over package structures that do not include the thermal paste and thermal connectors.

The layer 1010 and the metallization patterns 1004 of this embodiment can be included packages of the other disclosed embodiments of this disclosure.

By including thermal elements on a back-side of a semiconductor die, the thermal performance of the package structure may be improved. The thermal elements are utilized to dissipate heat from the package structures. In some embodiments, the thermal elements are not connected to thermal dissipation paths, while in some embodiments, the thermal elements are connected to thermal dissipation paths in the semiconductor die (see, e.g., FIG. 14). For example, the thermal elements can be connected to a via that is thermally coupled/connected to one or more transistors in the semiconductor die to dissipate the heat generated by the transistor(s). The embodiments of the present disclosure can improve the thermal resistance (° C./Watt) of the package structure by up to about 8% over a package structure that does not include the thermal elements on a back-side of a semiconductor die.

In an embodiment a package includes a first package structure including: a first integrated circuit die having an active side and a back-side, the active side including die connectors; a first through via adjacent the first integrated circuit die; an encapsulant laterally encapsulating the first integrated circuit die and the first through via; a first redistribution structure on and electrically connected to the die connectors of the first integrated circuit die and the first through via; and thermal elements on the back-side of the first integrated circuit die; and a second package structure bonded to the first through via and the thermal elements with a first set of conductive connectors. In an embodiment, the thermal elements are electrically isolated from integrated circuits within the first integrated circuit die. In an embodiment, the back-side of the first integrated circuit die is recessed from a surface of the encapsulant, the thermal elements being within the recess. In an embodiment, the thermal elements have sidewalls that are perpendicular to the back-side of the first integrated circuit die. In an embodiment, the thermal elements have sidewalls that taper from top surfaces to bottom surfaces of the thermal elements. In an embodiment, the thermal elements have sidewalls that widen from top surfaces to bottom surfaces of the thermal elements. In an embodiment, the thermal elements include a conductive paste and metallization patterns. In an embodiment, the package further includes an underfill surrounding the first set of conductive connectors, the underfill being between the first package structure and the second package structure. In an embodiment, the underfill contacts the thermal elements. In an embodiment, a central portion between the first package structure and the second package structure is free from conductive connectors. In an embodiment, the package further includes vias within the back-side of the first integrated circuit die, the thermal elements being thermally connected to the vias. In an embodiment, the first package structure further includes a second redistribution structure over the electrically connected to the first through via, the second redistribution structure being between the first integrated circuit die and the second package structure. In an embodiment, the package further includes a dummy die on the back-side of the first integrated circuit die, the thermal elements being on the dummy die.

In an embodiment, a method includes forming a first package including forming an electrical connector over a carrier substrate; attaching a first die to the carrier substrate using an adhesive layer, the electrical connector extending from a back-side of the first die to an active side of the first die, the active side being opposite the back-side, the electrical connector being adjacent the first die; encapsulating the first die and the electrical connector with a molding compound; forming a first redistribution structure overlying the active side of the first die, the molding compound, and the electrical connector; removing the carrier substrate to expose a first end of the electrical connector and the adhesive layer; removing the adhesive layer to expose the back-side of the first die; and forming thermal elements on the exposed back-side of the first die; forming a first set of conductive connectors over the thermal elements and the first end of the electrical connector; and bonding a second package to the first package using the first set of conductive connectors, the second package being proximate the back-side of the first die. In an embodiment, the method of further includes forming a second redistribution structure over the thermal elements on the back-side of the first die and over the first end of the first end of the electrical connector, the second redistribution structure being electrically connected to the electrical connector, the second package being bonded to the second redistribution structure. In an embodiment, the thermal elements are thermally connected to the second redistribution structure. In an embodiment, the method further includes planarizing the molding compound and the back-side of the first die to have level surfaces, the thermal elements being on the planarized surfaces of the back-side of the die and the molding compound. In an embodiment, forming thermal elements on the exposed back-side of the first die includes forming a seed layer on the exposed back-side of the first die; forming a dielectric layer on the seed layer; patterning holes through the dielectric layer to expose portions of the seed layer; and forming conductive material in the holes, the conductive material forming the thermal elements.

In an embodiment, a method includes forming a first package including: forming an electrical connector over a carrier substrate; attaching a first die to the carrier substrate using an adhesive layer, the first die including conductive pads within the adhesive layer on a back-side of the first die, the electrical connector extending from the back-side of the first die to an active side of the first die, the active side being opposite the back-side, the electrical connector being adjacent the first die; encapsulating the first die and the electrical connector with a molding compound; forming a redistribution structure overlying the active side of the first die, the molding compound, and the electrical connector; removing the carrier substrate to expose a first end of the electrical connector and the adhesive layer; removing the adhesive layer to expose the conductive pads and the back-side of the first die; and forming a first set of conductive connectors on the conductive pads and the first end of the electrical connector; and bonding a second package to the first package using the first set of conductive connectors, the second package being proximate the back-side of the first die. In an embodiment, the method further includes forming a second redistribution structure over the conductive pads on the back-side of the first die and over the first end of the first end of the electrical connector, the second redistribution structure being electrically connected to the electrical connector, the second package being bonded to the second redistribution structure.

In an embodiment, the method includes forming a first package including: forming a first metallization pattern and a second metallization pattern over a carrier substrate; forming and patterning a dielectric layer over first surfaces of the first and second metallization patterns, the patterned dielectric layer exposing portions of the first surfaces of both the first and second metallization patterns; forming an electrical connector over the dielectric layer and electrically connected to the first metallization pattern; attaching a first die to the dielectric layer using a first adhesive layer, the first adhesive layer contacting the exposed first surfaces of the second metallization pattern; encapsulating the first die and the electrical connector with a molding compound; forming a first redistribution structure overlying an active side of the first die, the molding compound, and the electrical connector; removing the carrier substrate, wherein after the removing, second surfaces of the first and second metallization patterns are exposed; forming a first set of conductive connectors over second surfaces of the first and second metallization patterns, at least one conductive connector of the first set of conductive connectors being electrically coupled to the electrical connector; and bonding a second package to the first package using the first set of conductive connectors, the second package being proximate a back-side of the first die, the back-side being opposite the active side. In an embodiment, the first adhesive layer is a conductive paste. In an embodiment, the method further includes forming a second set of conductive connectors on the first redistribution structure; and bonding the first package to a substrate using the second set of conductive connectors. In an embodiment, the method further includes forming vias in a back-side of the first die, the vias contacting the first adhesive layer.

In an embodiment, a package includes a first package structure including: a dummy die having a front-side and a back-side; a first integrated circuit die having a front-side and a back-side, the front-side including die connectors; a first attaching layer between and contacting the back-side of the first integrated circuit die and front-side of the dummy die; a first electrical connector adjacent the first integrated circuit die, the first attaching layer, and the dummy die; an encapsulant laterally encapsulating the first integrated circuit die, the dummy die, the first attaching layer, and the first electrical connector; a first redistribution structure on and electrically connected to the die connectors of the first integrated circuit die and the first electrical connector; and thermal elements on the back-side of the dummy die; and a second package structure bonded to the first electrical connector and the thermal elements with a first set of conductive connectors. In an embodiment, the first attaching layer is a conductive layer including a metal. In an embodiment, wherein the dummy die is made of metal. In an embodiment, the back-side of the dummy die is recessed from a surface of the encapsulant, the thermal elements being within the recess.

In an embodiment, a structure includes a first package structure including: a first redistribution structure including metallization patterns and dielectric layers; a first die over and electrically connected to the first redistribution structure, an active side of the first die including die connectors facing the first redistribution structure; a first through via adjacent the first die, the first through via electrically connected to the first redistribution structure; an encapsulant laterally encapsulating the first die and the through via; an attaching layer over a back-side of the first die, the back-side of the first die being opposite the active side, the attaching layer contacting the encapsulant; and a second redistribution structure over the attaching layer and the first through via, the second redistribution structure including metallization patterns and a dielectric layer, the second redistribution structure being electrically connected to the first through via; and a second package structure bonded to the metallization patterns of the second redistribution structure with a first set of conductive connectors. In an embodiment, the attaching layer is a conductive paste.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
    a first package structure comprising:
        a dummy die having a front-side and a back-side;
        a first integrated circuit die having a front-side and a back-side, the front-side comprising die connectors;
        a first attaching layer between and contacting the back-side of the first integrated circuit die and front-side of the dummy die;
        a first electrical connector adjacent the first integrated circuit die, the first attaching layer, and the dummy die;
        an encapsulant laterally encapsulating the first integrated circuit die, the dummy die, the first attaching layer, and the first electrical connector, outermost sidewalls of the first attaching layer being surrounded by and contacting the encapsulant;
        a first redistribution structure on and electrically connected to the die connectors of the first integrated circuit die and the first electrical connector; and
        thermal elements on the back-side of the dummy die; and
    a second package structure bonded to the first electrical connector and the thermal elements with a first set of conductive connectors.

2. The package of claim 1, wherein the first attaching layer is a conductive layer comprising a metal.

3. The package of claim 1, wherein the dummy die is made of metal.

4. The package of claim 1, wherein the back-side of the dummy die is recessed from a surface of the encapsulant, the thermal elements being within the recess.

5. A structure comprising:
    a first package structure comprising:
        a first redistribution structure comprising metallization patterns and dielectric layers;
        a first die over and electrically connected to the first redistribution structure, an active side of the first die comprising die connectors facing the first redistribution structure;
        a dummy die over the first die;
        a first layer between and contacting the dummy die and the first die, the first layer being a single, continuous layer from the dummy die to the first die;
        a first through via adjacent the first die and the dummy die, the first through via electrically connected to the first redistribution structure;
        an encapsulant laterally encapsulating the first die, the dummy die, and the first through via; and
        thermal elements on a back-side of the dummy die;

a second redistribution structure over the back-side of the dummy die and the first through via, the second redistribution structure comprising metallization patterns and a dielectric layer, the second redistribution structure being electrically connected to the first through via; and a second package structure bonded to the metallization patterns of the second redistribution structure with a first set of conductive connectors.

6. The structure of claim 5 further comprising:

an attaching layer between and contacting a back-side of the first die and a front-side of the dummy die wherein the dummy die is made of metal, and wherein the attaching layer is made of metal.

7. The structure of claim 5, wherein the back-side of the dummy die is recessed from a surface of the encapsulant, the thermal elements being within the recess.

8. A package comprising:

a first package structure comprising:
- a first integrated circuit die having an active side comprising die connectors;
- a first through via adjacent the first integrated circuit die;
- an encapsulant surrounding and physically contacting both the first integrated circuit die and the first through via, the encapsulant being a continuous material from the first through via to the first integrated circuit die;
- a first redistribution structure over and electrically connected to the die connectors of the first integrated circuit die and the first through via; and
- thermal elements over a back-side of the first integrated circuit die, the back-side being opposite the active side; and a second package structure bonded to the first through via and the thermal elements with a first set of conductive connectors.

9. The package of claim 8 further comprising:

a dummy die over the back-side of the first integrated circuit die, the thermal elements being over the dummy die.

10. The package of claim 8, wherein the thermal elements are electrically isolated from integrated circuits within the first integrated circuit die.

11. The package of claim 8, wherein the back-side of the first integrated circuit die is recessed from a surface of the encapsulant, the thermal elements being within the recess.

12. The package of claim 8, wherein the thermal elements have sidewalls that are perpendicular to the back-side of the first integrated circuit die.

13. The package of claim 8, wherein the thermal elements have sidewalls that taper from top surfaces to bottom surfaces of the thermal elements.

14. The package of claim 8, wherein the thermal elements have sidewalls that widen from top surfaces to bottom surfaces of the thermal elements.

15. The package of claim 8, wherein the thermal elements comprise a conductive paste and metallization patterns.

16. The package of claim 8 further comprising:

an underfill surrounding the first set of conductive connectors, the underfill being between the first package structure and the second package structure.

17. The package of claim 16, wherein the underfill contacts the thermal elements.

18. The package of claim 8, wherein a central portion between the first package structure and the second package structure is free from conductive connectors.

19. The package of claim 8 further comprising:

vias within the back-side of the first integrated circuit die, the thermal elements being thermally connected to the vias.

20. The package of claim 8, wherein the first package structure further comprises:

a second redistribution structure over and electrically connected to the first through via, the second redistribution structure being between the first integrated circuit die and the second package structure.

* * * * *